(12) United States Patent
Yang et al.

(10) Patent No.: US 12,660,593 B2
(45) Date of Patent: Jun. 16, 2026

(54) INTERCONNECT STRUCTURE

(71) Applicant: TAIWAN SEMICONDUCTOR MANUFACTURING CO., LTD., Hsinchu (TW)

(72) Inventors: Shin-Yi Yang, New Taipei Clty (TW); Ming-Han Lee, Taipei Clty (TW); Shau-Lin Shue, Hsinchu Clty (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 525 days.

(21) Appl. No.: 18/173,283

(22) Filed: Feb. 23, 2023

(65) Prior Publication Data

US 2023/0223334 A1 Jul. 13, 2023

Related U.S. Application Data

(60) Continuation of application No. 16/714,444, filed on Dec. 13, 2019, now Pat. No. 11,594,483, which is a division of application No. 15/715,327, filed on Sep. 26, 2017, now Pat. No. 10,510,657.

(51) Int. Cl.
  *H10W 20/42* (2026.01)
  *H10W 20/00* (2026.01)
  (Continued)

(52) U.S. Cl.
  CPC ........... *H10W 20/42* (2026.01); *H10W 20/01* (2026.01); *H10W 20/033* (2026.01); *H10W 20/037* (2026.01); *H10W 20/038* (2026.01); *H10W 20/039* (2026.01); *H10W 20/056* (2026.01); *H10W 20/062* (2026.01); *H10W*

*20/075* (2026.01); *H10W 20/081* (2026.01); *H10W 20/082* (2026.01); *H10W 20/0886* (2026.01); *H10W 20/425* (2026.01); *H10W 20/435* (2026.01); *H10W 20/4405* (2026.01);
  (Continued)

(58) Field of Classification Search
  CPC ............ H01L 23/5226; H01L 23/5283; H01L 23/53223; H01L 23/53238; H01L 23/53252; H01L 23/53266; H01L 23/53276; H10W 20/033; H10W 20/037; H10W 20/038; H10W 20/039; H10W 20/056; H10W 20/062; H10W 20/081; H10W 20/082; H10W 20/0886; H10W 20/42; H10W 20/425; H10W 20/435; H10W 20/4403; H10W 20/4405; H10W 20/4407; H10W 20/4421; H10W 20/4424; H10W 20/4432; H10W 20/4435; H10W 20/4437; H10W 20/4441; H10W 20/4446; H10W 20/462; H10W 20/48
  See application file for complete search history.

(56) References Cited

U.S. PATENT DOCUMENTS

| 5,512,514 A | 4/1996 | Lee |
| 5,635,423 A | 6/1997 | Huang et al. |

(Continued)

*Primary Examiner* — Marcos D. Pizarro
(74) *Attorney, Agent, or Firm* — Maschoff Brennan

(57) ABSTRACT

A interconnect structure includes a lower metal, a dielectric layer, an upper metal, and a graphene layer. The dielectric layer laterally surrounds the lower metal. The upper metal is over the lower metal. The graphene layer is over a top surface of the upper metal and opposite side surfaces of the upper metal from a cross-sectional view.

20 Claims, 20 Drawing Sheets

(51) Int. Cl.
  *H10W 20/41* (2026.01)
  *H10W 20/44* (2026.01)
  *H10W 20/48* (2026.01)

(52) U.S. Cl.
  CPC ... *H10W 20/4407* (2026.01); *H10W 20/4421* (2026.01); *H10W 20/4424* (2026.01); *H10W 20/4432* (2026.01); *H10W 20/4435* (2026.01); *H10W 20/4441* (2026.01); *H10W 20/4446* (2026.01); *H10W 20/4462* (2026.01); *H10W 20/48* (2026.01); *H10W 20/4403* (2026.01)

(56)                References Cited

U.S. PATENT DOCUMENTS

| 6,376,353 | B1 | 4/2002 | Zhou |
| 8,895,433 | B2 | 11/2014 | Bonilla |

| 2002/0086518 | A1 | | 7/2002 | Asami |
| 2003/0022413 | A1 | | 1/2003 | Nakashiba |
| 2003/0080428 | A1 | | 5/2003 | Izumitani et al. |
| 2003/0089928 | A1 | | 5/2003 | Saito |
| 2004/0155342 | A1 | | 8/2004 | Usami et al. |
| 2005/0189655 | A1 | | 9/2005 | Furukawa |
| 2006/0211235 | A1 | | 9/2006 | Usami |
| 2008/0006944 | A1 | | 1/2008 | Yang |
| 2008/0157380 | A1 | | 7/2008 | Hong |
| 2011/0304026 | A1 | | 12/2011 | Tsui |
| 2014/0127896 | A1 | | 5/2014 | Bonilla |
| 2014/0291819 | A1 | * | 10/2014 | Barth ................... H10K 85/221 |
| | | | | 257/659 |
| 2014/0367857 | A1 | | 12/2014 | Yang et al. |
| 2016/0005648 | A1 | | 1/2016 | Yang et al. |
| 2016/0108546 | A1 | | 4/2016 | Park et al. |
| 2017/0011996 | A1 | | 1/2017 | Lee |
| 2018/0350913 | A1 | | 12/2018 | Yang et al. |

\* cited by examiner 400 providing a substrate 410 forming a first dielectric layer 420 forming a via in the first dielectric layer 430 forming a first capping layer on a top surface of the via 440 forming a line 450 forming a second capping layer on a top surface of the line to peripherally enclose a side surface of the line 600    providing a substrate 610    forming a first dielectric layer 620    forming a via in the first dielectric layer 630    forming a barrier layer 640    forming a line on the barrier layer 650    forming a capping layer on a top surface of the line to peripherally enclose a side surface of the line

INTERCONNECT STRUCTURE

PRIORITY CLAIM AND CROSS-REFERENCE

The present application is a Continuation Applications of U.S. application Ser. No. 16/714,444, filed Dec. 13, 2019, now U.S. Pat. No. 11,594,483, issued Feb. 28, 2023, which is a Divisional Applications of the U.S. application Ser. No. 15/715,327, filed Sep. 26, 2017, now U.S. Pat. No. 10,510,657, issued Dec. 17, 2019.

BACKGROUND

In a semiconductor device, an interconnecting structure can be used to electrically connect devices in different layers or in the same layer in an integrated circuit. However, as semiconductor devices continue to be scaled down, an interval between adjacent devices is increasingly shrunk, and a process window of the interconnecting structure is significantly decreased. Accordingly, it is more and more difficult to manufacturing the interconnecting structure between the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
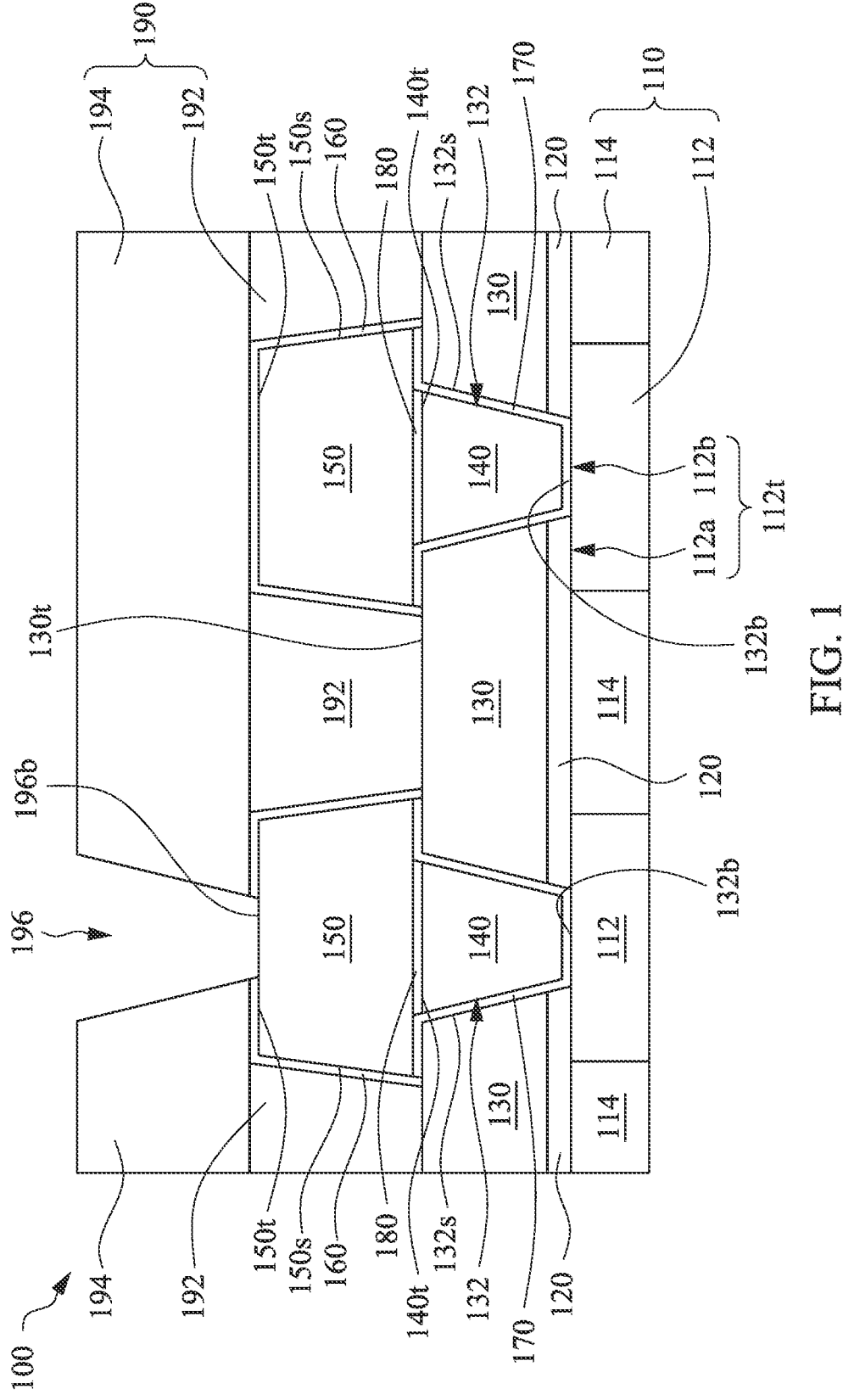
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical process for manufacturing an interconnecting structure of a semiconductor device, during a patterning process of a line, a corner of a via under the line may be etched and damaged due to a photolithography overlapping shift. Furthermore, a liner layer is additionally formed to cover the line to improve the reliability, and a barrier layer is formed to cover the liner layer. However, the additional liner layer and barrier layer degrade the RC (resistance and capacitance) performance of the semiconductor device and increase the fabrication cost. Moreover, in a via hole patterning process of a dielectric layer over the line, an additional etching stop layer is needed for the etching stop of the via hole patterning process. However, the etching stop layer causes the capacitance impact and increases the fabrication cost.

Embodiments of the present disclosure are directed to providing a semiconductor device and a method for manufacturing the semiconductor device, in which a capping layer having an etch selectivity with respect to a line may be disposed on a top surface of a via, such that the capping layer may prevent the via from being damaged during a patterning process of the line. The via may be formed from a conductive material which has an etch selectivity with respect to the line, such that the via is not damaged during the patterning process of the line. Furthermore, another capping layer having an etch selectivity with respect to the line is formed to cap the line, such that a liner layer and a barrier layer are omitted, thereby enhancing the RC performance of the semiconductor device and reducing the fabrication cost. Moreover, since the capping layer covering the line has an etch selectivity with respect to the line, the capping layer is used as an etching stop layer, and the typical etching stop layer is omitted, thereby preventing the capacitance impact and reducing the fabrication cost.

FIG. 1 is schematic cross-sectional view of a semiconductor device in accordance with various embodiments. In some embodiments, a semiconductor device 100 includes a substrate 110, a dielectric layer 130, one or more vias 140, one or more lines 150, and one or more capping layers 160. In some exemplary examples, the substrate 110 includes at least one dielectric layer 114 and at least one conductive layer 112, in which the conductive layer 112 is disposed in the dielectric layer 114. The dielectric layer 114 may be formed from $SiO_x$, $SiO_xC_yH_z$, $SiO_xC_y$, $SiC_x$, $SiN_x$, or a low dielectric constant (K) material. The conductive layer 112 may be formed from metal, such as Cu, Ni, Co, Ru, Ir, Al, Pt, Pd, Au, Ag, Os, W, Mn, or alloys thereof. In some certain examples, the conductive layer 112 may include an implant region. Each conductive layer 112 has a top surface 112*t*, in which the top surface 112*t* is not covered by the dielectric layer 114. The top surface 112*t* of the conductive layer 112 has a first portion 112*a* and a second portion 112*b*.

The dielectric layer 130 is disposed on portions of the substrate 110. In some exemplary examples, as shown in FIG. 1, the semiconductor device 100 may optionally include an etching stop layer 120, in which the etching stop layer 120 is disposed between the substrate 110 and the dielectric layer 130. The etching stop layer 120 has an etch selectivity with respect to the dielectric layer 130. The dielectric layer 130 has one or more via holes 132. The via holes 132 may correspond to the conductive layers 112 respectively, and each of the via holes 132 extends from the dielectric layer 130 passing through the etching stop layer 120 to the top surface 112*t* of the conductive layer 112 and exposes a second portion 112*b* of the top surface 112*t* of the conductive layer 112. Thus, the etching stop layer 120 and the dielectric layer 130 are disposed on the dielectric layer 114 and the first portions 112*a* of the top surfaces 112*t* of the conductive layers 112. A dielectric constant value of the dielectric layer 130 may be in a range substantially from 1.0 to 3.8. For example, the dielectric layer 130 may be formed from $SiO_x$, $SiO_xC_yH_z$, $SiO_xC_y$, $SiC_x$, $SiN_x$, or a low-K material.

In some examples, as shown in FIG. 1, the semiconductor device 100 may optionally include one or more barrier layers 170. Each of the barrier layers 170 covers a sidewall 132*s* and a bottom 132*b* of the via hole 132 and a portion of a top surface 130*t* of the dielectric layer 130. In some exemplary examples, each of the barrier layers 170 conformally covers the sidewall 132*s* and the bottom 132*b* of the via hole 132 and the portion of the top surface 130*t* of the dielectric layer 130. The barrier layers 170 are suitable to prevent the material of the vias 140, which are disposed in the via holes 132, from diffusing to the dielectric layer 130 and/or the dielectric layer 114 of the substrate 110. For example, the barrier layers 170 may be formed from $TaN_x$.

Referring to FIG. 1 again, the vias 140 are respectively disposed on the barrier layers 170 in the via holes 132 which are formed in the dielectric layer 130 and the etching stop layer 120. The via holes 132 respectively expose the second portions 112*b* of the top surfaces 112*t* of the conductive layers 112, such that the vias 140 are respectively disposed on the second portions 112*b* of the top surfaces 112*t* of the conductive layers 112. Each of the barrier layers 170 is disposed between the via 140 and the dielectric layer 130, between the via 140 and the conductive layer 112, and between the via 140 and the etching stop layer 120. For example, the vias 140 may be formed from metal, such as Cu, Ni, Co, Ru, Ir, Al, Pt, Pd, Au, Ag, Os, W, Mn, or alloys thereof.

Optionally, as shown in FIG. 1, the semiconductor device 100 may include one or more capping layers 180. The capping layers 180 respectively cover top surfaces 140*t* of the vias 140. In some exemplary examples, the capping layers 180 have an etch selectivity with respect to the vias 140. The capping layers 180 may be formed from a conductive material. For example, the capping layers 180 are formed from graphene. A thickness of each of the capping layers 180 may be in a range substantially from 3 angstroms to 30 angstroms.

The lines 150 are respectively disposed on the capping layers 180 on the vias 140 and the barrier layers 170 on the portions of the dielectric layer 130, such that the capping layers 180 are disposed between the lines 150 and the vias 140, and the barrier layers 170 are disposed between the lines 150 and the portions of the dielectric layer 130. The lines 150 have an etch selectivity with respect to the capping layers 180. For example, the lines 150 may be formed from metal, such as Cu, Ni, Co, Ru, Ir, Al, Pt, Pd, Au, Ag, Os, W, Mn, or alloys thereof.

Each of the capping layers 160 is disposed on a top surface 150*t* of the line 150 and peripherally encloses a side surface 150*s* of the line 150. The capping layers 160 have an etch selectivity with respect to the lines 150. In some examples, the capping layers 160 are formed from a conductive material. For example, the capping layers 160 are formed from graphene. A thickness of each of the capping layers 160 may be in a range substantially from 3 angstroms to 30 angstroms.

In some examples, as shown in FIG. 1, the semiconductor device 100 may include a dielectric layer 190. The dielectric layer 190 is disposed on the dielectric layer 130 and the capping layers 160 to peripherally enclose the lines 150. The dielectric layer 190 may have at least one via hole 196. The via hole 196 extends from the dielectric layer 190 to the capping layer 160 or to the line 150, that is a bottom 196*b* of the via hole 196 exposes the capping layer 160 or the line 150. For example, the dielectric layer 190 may be formed from $SiO_x$, $SiO_xC_yH_z$, $SiO_xC_y$, $SiC_x$, $SiN_x$, or a low-K material. The dielectric layer 190 may be a single-layered structure. In some exemplary examples, as shown in FIG. 1, the dielectric layer 190 includes a first dielectric layer 192 and a second dielectric layer 194, in which the first dielectric layer 192 is disposed on the dielectric layer 130 to peripherally enclose the lines 150, the second dielectric layer 194 is disposed on the first dielectric layer 192 and the capping layer 160, and the via hole 196 is formed in the second dielectric layer 194 over the line 150.

The capping layers 180 has an etch selectivity with respect to the lines 150, such that the capping layers 180 may prevent the vias 140 from being damaged during a patterning process of the lines 150. Furthermore, the capping layers 160 have an etch selectivity with respect to the lines 150, such that liner layers and barrier layers are omitted, thereby enhancing the RC performance of the semiconductor device 100 and reducing the fabrication cost. Moreover, the capping layers 160 is used as etching stop layers during a patterning process of the via hole 196, such that an additional etching stop layer is omitted, thereby preventing the capacitance impact and reducing the fabrication cost.

Figure 2:
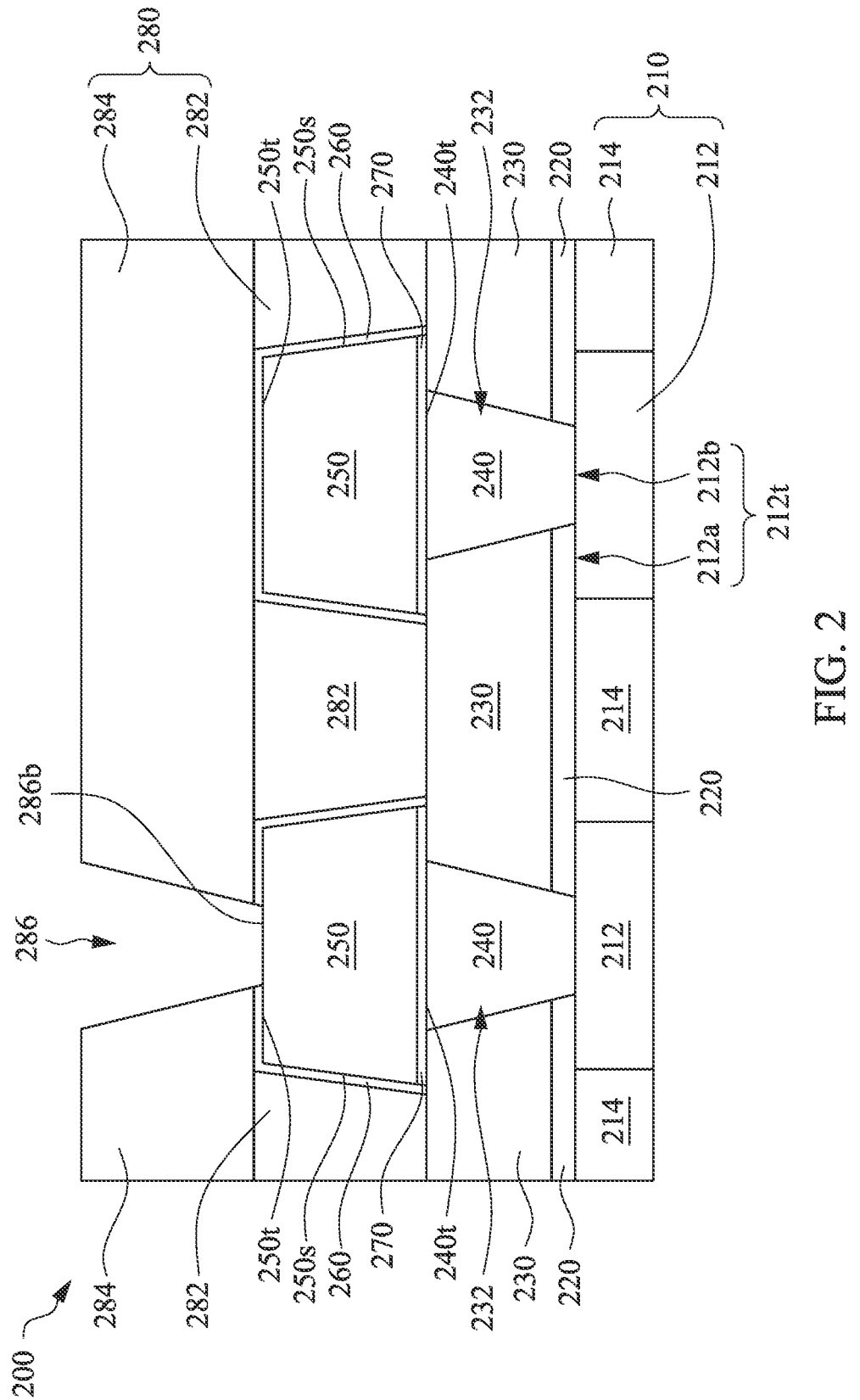
FIG. 2 is a schematic cross-sectional view of a semiconductor device in accordance with various embodiments.

FIG. 2 is schematic cross-sectional view of a semiconductor device in accordance with various embodiments. In some embodiments, a semiconductor device 200 includes a substrate 210, a dielectric layer 230, one or more vias 240, one or more lines 250, and one or more capping layers 260. In some exemplary examples, the substrate 210 includes at least one dielectric layer 214 and at least one conductive layer 212, in which the conductive layer 212 is disposed in the dielectric layer 214. The dielectric layer 214 may be formed from $SiO_x$, $SiO_xC_yH_z$, $SiO_xC_y$, $SiC_x$, $SiN_x$, or a low-K material. The conductive layer 212 may be formed from metal, such as Cu, Ni, Co, Ru, Ir, Al, Pt, Pd, Au, Ag, Os, W, Mn, or alloys thereof. In certain examples, the conductive layer 212 may include an implant region. Each conductive layer 212 has a top surface 212*t*, which is not covered by the dielectric layer 214. The top surface 212*t* of the conductive layer 212 has a first portion 212*a* and a second portion 212*b*.

As shown in FIG. 2, the dielectric layer 230 is disposed on portions of the substrate 210. Optionally, the semiconductor device 200 may include an etching stop layer 220, in which the etching stop layer 220 is disposed between the substrate 210 and the dielectric layer 230. The etching stop layer 220 has an etch selectivity with respect to the dielectric layer 230. The dielectric layer 230 has one or more via holes 232. The via holes 232 may correspond to the conductive layers 212 respectively, and each of the via holes 232 extends from the dielectric layer 230 passing through the etching stop layer 220 to the top surface 212t of the conductive layer 212 and exposes a second portion 212b of the top surface 212t of the conductive layer 212. Thus, the etching stop layer 220 and the dielectric layer 230 are disposed on the dielectric layer 214 and the first portions 212a of the top surfaces 212t of the conductive layers 212. A dielectric constant value of the dielectric layer 230 may be in a range substantially from 1.0 to 3.8. For example, the dielectric layer 230 may be formed from $SiO_x$, $SiO_xC_yH_z$, $SiO_xC_y$, $SiC_x$, $SiN_x$, or a low-K material.

Referring to FIG. 2 again, the vias 240 are respectively disposed in the via holes 232 which are formed in the dielectric layer 230 and the etching stop layer 220. The via holes 232 respectively expose the second portions 212b of the top surfaces 212t of the conductive layers 212, such that the vias 240 are respectively disposed on the second portions 212b of the top surfaces 212t of the conductive layers 212. For example, the vias 240 may be formed from metal, such as Cu, Ni, Co, Ru, Ir, Al, Pt, Pd, Au, Ag, Os, W, Mn, or alloys thereof.

In some examples, as shown in FIG. 2, the semiconductor device 200 may optionally include one or more barrier layers 270. The barrier layers 270 respectively cover top surfaces 240t of the vias 240, and portions of the dielectric layer 230. The barrier layers 270 are suitable to prevent the material of the vias 240 from diffusing. For example, the barrier layers 270 may be formed from $TaN_x$.

The lines 250 are respectively disposed on the barrier layers 270 on the vias 240 and the portions of the dielectric layer 230, such that the barrier layers 270 are disposed between the lines 250 and the vias 240, and between the lines 250 and the portions of the dielectric layer 230. A material of the vias 240 is different from a material of the lines 250, and the lines 250 have an etch selectivity with respect to the vias 240. For example, the lines 250 may be formed from metal, such as Cu, Ni, Co, Ru, Ir, Al, Pt, Pd, Au, Ag, Os, W, Mn, or alloys thereof.

Each of the capping layers 260 is disposed on a top surface 250t of the line 250 and peripherally encloses a side surface 250s of the line 250. The capping layers 260 have an etch selectivity with respect to the lines 250. In some examples, the capping layers 260 are formed from a conductive material. For example, the capping layers 260 are formed from graphene. A thickness of each of the capping layers 260 may be in a range substantially from 3 angstroms to 30 angstroms.

In some examples, as shown in FIG. 2, the semiconductor device 200 may include a dielectric layer 280. The dielectric layer 280 is disposed on the dielectric layer 230 and the capping layers 260 to peripherally enclose the lines 250. The dielectric layer 280 may have at least one via hole 286. The via hole 286 extends from the dielectric layer 280 to the capping layer 260 or to the line 250, that is a bottom 286b of the via hole 286 exposes the capping layer 260 or the line 250. For example, the dielectric layer 280 may be formed from $SiO_x$, $SiO_xC_yH_z$, $SiO_xC_y$, $SiC_x$, $SiN_x$, or a low-K material. The dielectric layer 280 may be a single-layered structure. In some exemplary examples, as shown in FIG. 2, the dielectric layer 280 includes a first dielectric layer 282 and a second dielectric layer 284, in which the first dielectric layer 282 is disposed on the dielectric layer 230 to peripherally enclose the lines 250, the second dielectric layer 284 is disposed on the first dielectric layer 282 and the capping layer 260, and the via hole 286 is formed in the second dielectric layer 284 over the line 250.

The vias 240 have an etch selectivity with respect to the lines 250, such that it may prevent the vias 240 from being damaged during a patterning process of the lines 250. Furthermore, the capping layers 260 have an etch selectivity with respect to the lines 250, such that the semiconductor device 200 does not need additional liner layers and barrier layers, thereby enhancing the RC performance of the semiconductor device 100 and reducing the fabrication cost. Moreover, the capping layers 260 is used as etching stop layers during a patterning process of the via hole 286, such that an additional etching stop layer is omitted, thereby preventing the capacitance impact and reducing the fabrication cost.

Figure 3A:
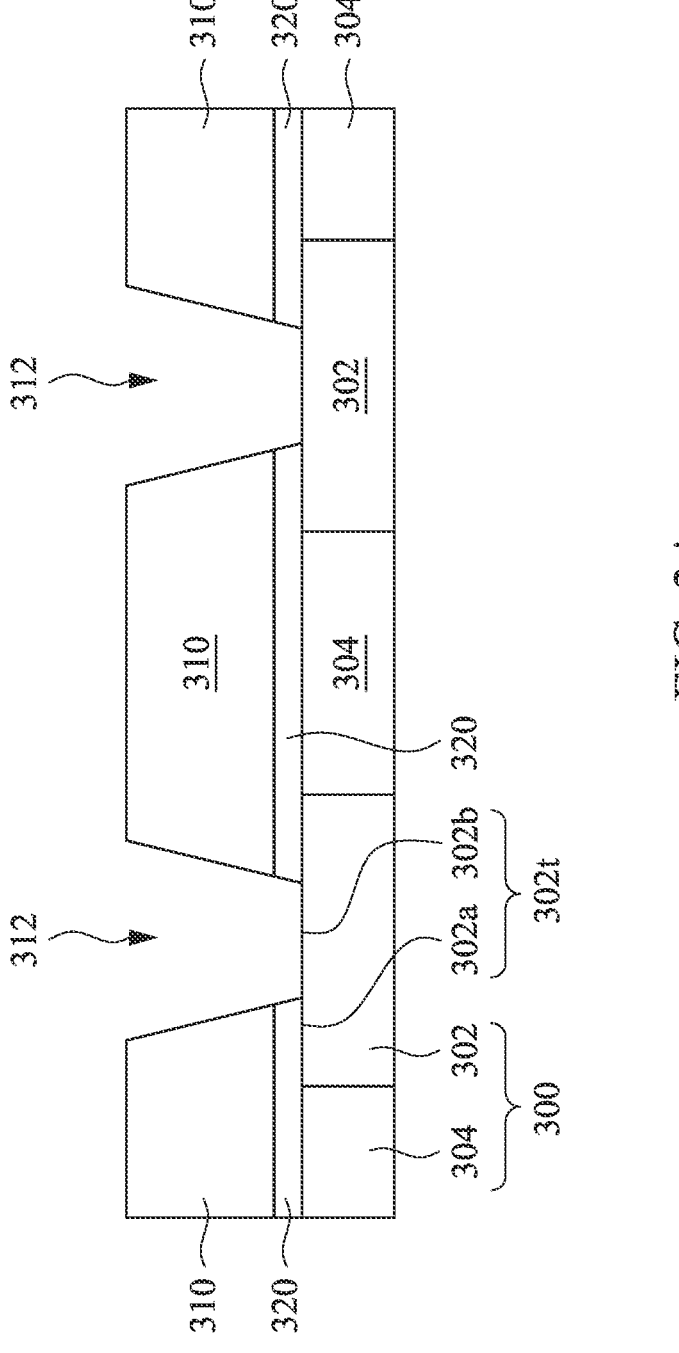
FIG. 3A through FIG. 3I are schematic cross-sectional views of intermediate stages showing a method for manufacturing a semiconductor device in accordance with various embodiments.

FIG. 3A through FIG. 3I are schematic cross-sectional views of intermediate stages showing a method for manufacturing a semiconductor device in accordance with various embodiments. As shown in FIG. 3A, a substrate 300 is provided. In some exemplary examples, the substrate 300 is provided to include at least one dielectric layer 304 and at least one conductive layer 302, in which the conductive layer 302 is formed in the dielectric layer 304. The dielectric layer 304 may be formed from $SiO_x$, $SiO_xC_yH_z$, $SiO_xC_y$, $SiC_x$, $SiN_x$, or a low-K material. The conductive layer 302 may be formed from metal, such as Cu, Ni, Co, Ru, Ir, Al, Pt, Pd, Au, Ag, Os, W, Mn, or alloys thereof. In some certain examples, the conductive layer 302 may be formed to include an implant region. A top surface 302t of the conductive layer 302 is not covered by the dielectric layer 304. The top surface 302t of the conductive layer 302 is formed to have a first portion 302a and a second portion 302b.

Referring to FIG. 3A again, a dielectric layer 310 is formed on portions of the substrate 300 by using, for example, a chemical vapor deposition (CVD) process or plasma-enhanced chemical vapor deposition (PECVD) process. In some exemplary examples, a process temperature in forming the dielectric layer 310 is substantially equal to or smaller than 425 degrees centigrade. In some examples, before forming the dielectric layer 310, an etching stop layer 320 may be optionally formed to cover the substrate 300, such that the etching stop layer 320 is disposed between the substrate 300 and the dielectric layer 310. The etching stop layer 320 has an etch selectivity with respect to the dielectric layer 310. A dielectric constant value of the dielectric layer 310 may be in a range substantially from 1.0 to 3.8. For example, the dielectric layer 310 may be formed from $SiO_x$, $SiO_xC_yH_z$, $SiO_xC_y$, $SiC_x$, $SiN_x$, or a low-K material.

Figure 3B:
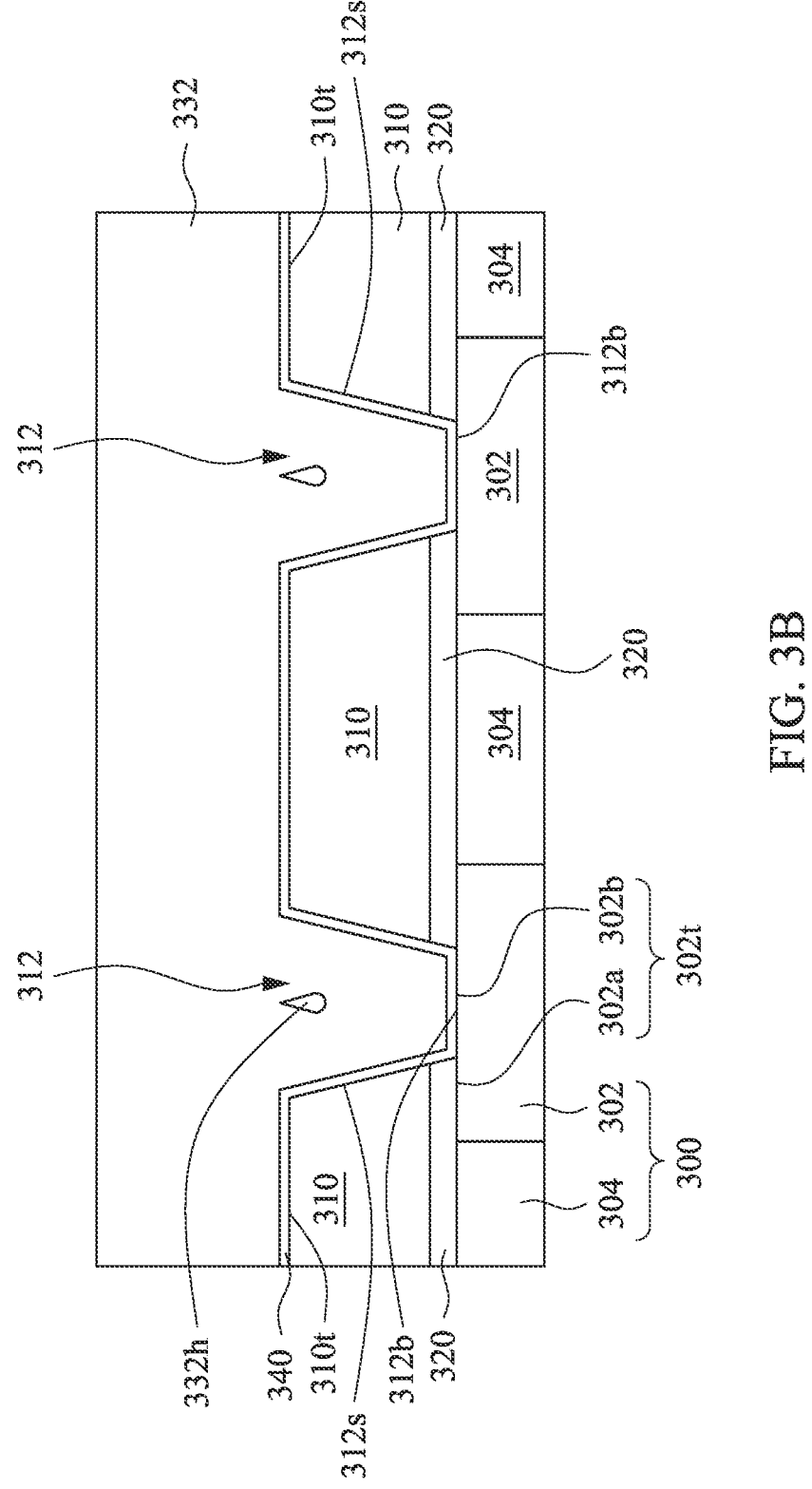
Figure 3C:
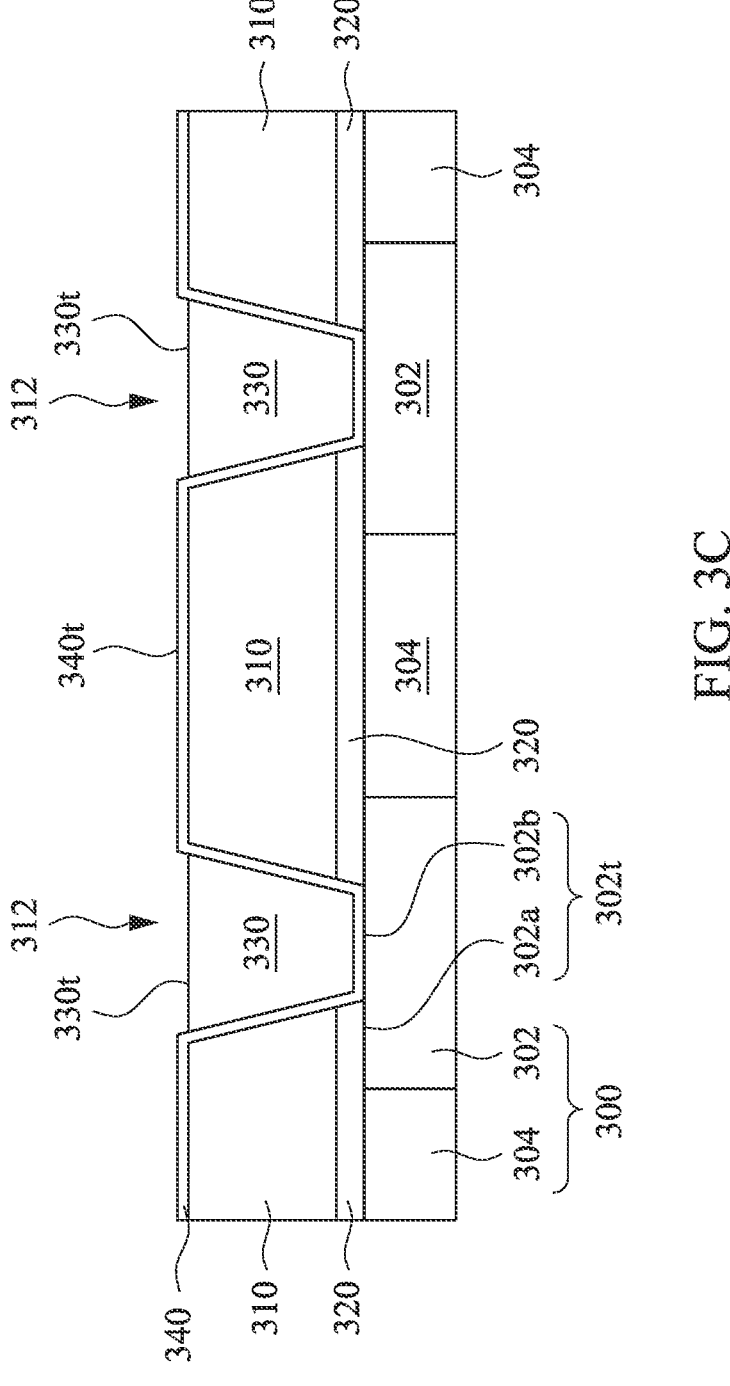

After the dielectric layer 310 is formed on the etching stop layer 320, as shown in FIG. 3C, one or more vias 330 are formed in the dielectric layer 310 on the second portions 302b of the top surfaces 302t of the conductive layers 302 respectively. In some examples, in forming the vias 330, one or more via holes 312 are formed in the dielectric layer 310 and the etching stop layer 320 by using, for example, a photolithography technique and an etch technique. The via holes 312 correspond to the conductive layers 302 respectively, and each of the via holes 312 extends from the dielectric layer 310 passing through the etching stop layer 320 to the top surface 302t of the conductive layer 302 and exposes the second portion 302b of the top surface 302t of the conductive layer 302. After the via holes 312 are completed, the etching stop layer 320 and the dielectric layer 310 are located on the dielectric layer 304 and the first portions 302a of the top surfaces 302t of the conductive layers 302.

As shown in FIG. 3B, after the via holes 312 are formed, a barrier layer 340 may be optionally formed to cover a sidewall 312$s$ and a bottom 312$b$ of each of the via holes 312 and a top surface 310$t$ of the dielectric layer 310. In some exemplary examples, the barrier layer 340 conformally covers the sidewalls 312$s$ and the bottoms 312$b$ of the via holes 312 and the top surface 310$t$ of the dielectric layer 310. The barrier layer 340 is suitable to prevent the material of the vias 330, which are disposed in the via holes 312, from diffusing to the dielectric layer 310 and/or the dielectric layer 304 of the substrate 300. For example, the barrier layer 340 may be formed by using a chemical vapor deposition process or a plasma-enhanced chemical vapor deposition process. The barrier layer 340 may be formed from TaN$_x$.

Referring to FIG. 3B again, a via material layer 332 is formed on the barrier layer 340 to fill the via holes 312 with the via material layer 332. For example, the via material layer 332 may be formed by using an atomic layer deposition (ALD) process, a chemical vapor deposition process, or an electroless deposition (ELD) process. The via material layer 332 may be formed from metal, such as Cu, Ni, Co, Ru, Ir, Al, Pt, Pd, Au, Ag, Os, W, Mn, or alloys thereof. Optionally, after the via material layer 332 is completed, the via material layer 332 may be annealed to eliminate holes 332$h$ which may be formed in the via material layer 332. In some exemplary examples, process temperatures in forming and annealing the via material layer 332 are substantially equal to or smaller than 425 degrees centigrade.

As shown in FIG. 3C, a portion of the via material layer 332, which is disposed on the barrier layer 340 on the top surface 310$t$ of the dielectric layer 310, is removed to form the vias 330 respectively in the via holes 312. Thus, the vias 330 are formed in the dielectric layer 310 on the second portions 302$b$ of the top surfaces 302$t$ of the conductive layers 302. The portion of the via material layer 332 may be removed by using a polishing technique or an etch technique. For example, a chemical mechanical polishing process may be performed on the via material layer 332 to remove the portion of the via material layer 332. A top surface 330$t$ of each of the vias 330 may be elevated at the same level with a top 340$t$ of the barrier layer 340. The top surface 330$t$ of each of the vias 330 may be lower than the top 340$t$ of the barrier layer 340. In certain examples, the top surface 330$t$ of each of the vias 330 may be higher than the top 340$t$ of the barrier layer 340.

Figure 3D:
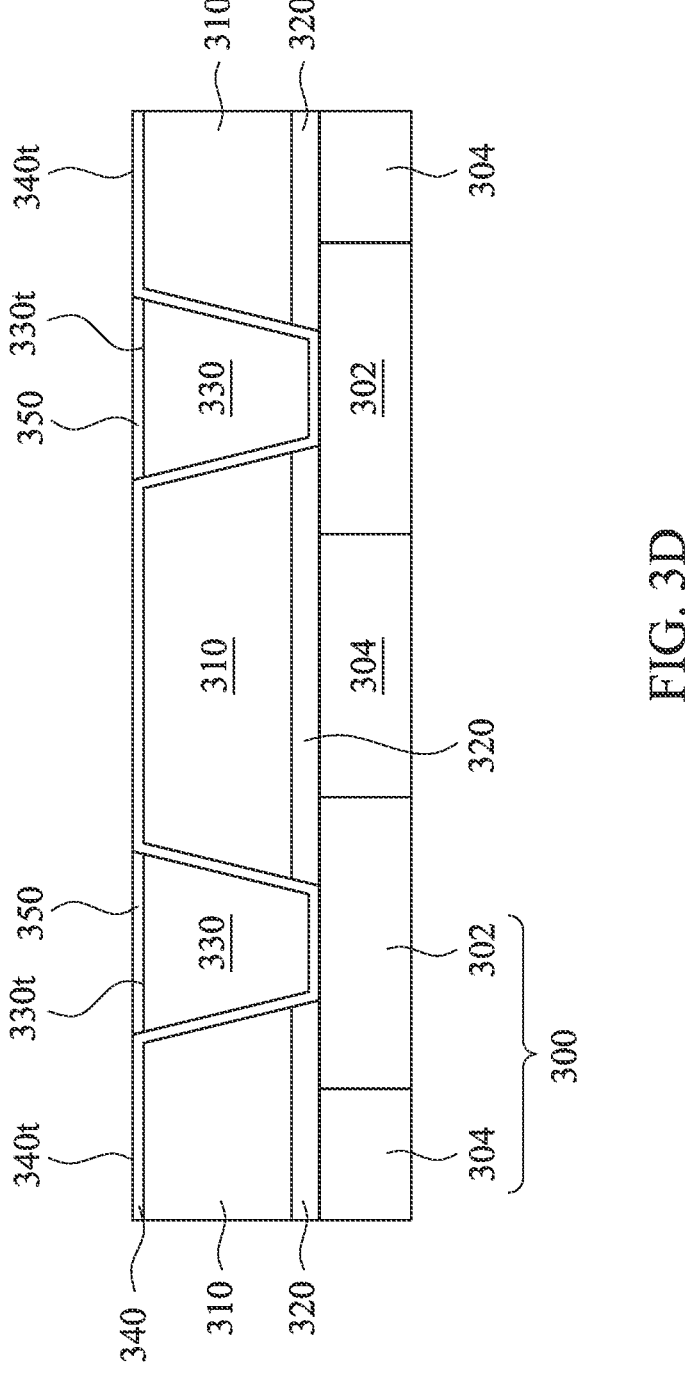

As shown in FIG. 3D, first capping layers 350 are respectively formed on top surfaces 330$t$ of the vias 330. The first capping layers 350 cover the top surfaces 330$t$ of the vias 330. The first capping layers 350 may have an etch selectivity with respect to the vias 330. The first capping layers 350 may be formed from a conductive material. In some exemplary examples, the first capping layers 350 are formed from graphene. For example, the first capping layers 350 may be formed by using an atomic layer deposition process, a chemical vapor deposition process, a plasma-enhanced atomic layer deposition process, or a plasma-enhanced chemical vapor deposition process. A process temperature of forming the first capping layers 350 may be in a range substantially from 25 degrees centigrade to 1000 degrees centigrade. For example, the process temperature of forming the first capping layers 350 may be in a range substantially from 25 degrees centigrade to 425 degrees centigrade. Each of the first capping layers 350 may be formed to have a thickness substantially ranging from 3 angstroms to 30 angstroms. A top surface 350$t$ of each of the first capping layers 350 may be lower than the top 340$t$ of the barrier layer 340. In certain examples, the top surface 350$t$ of each of the first capping layers 350 may be higher than or may be elevated at the same level with the top 340$t$ of the barrier layer 340.

In some exemplary examples, the first capping layers 350 include graphene layers, and the graphene layers are formed by using a chemical vapor deposition process or a plasma-enhanced chemical vapor deposition process. The graphene layers are grown under the catalyst of the vias 330. In the chemical vapor deposition process or a plasma-enhanced chemical vapor deposition process, reactants may include C$_x$H$_y$ and H$_2$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 3E:
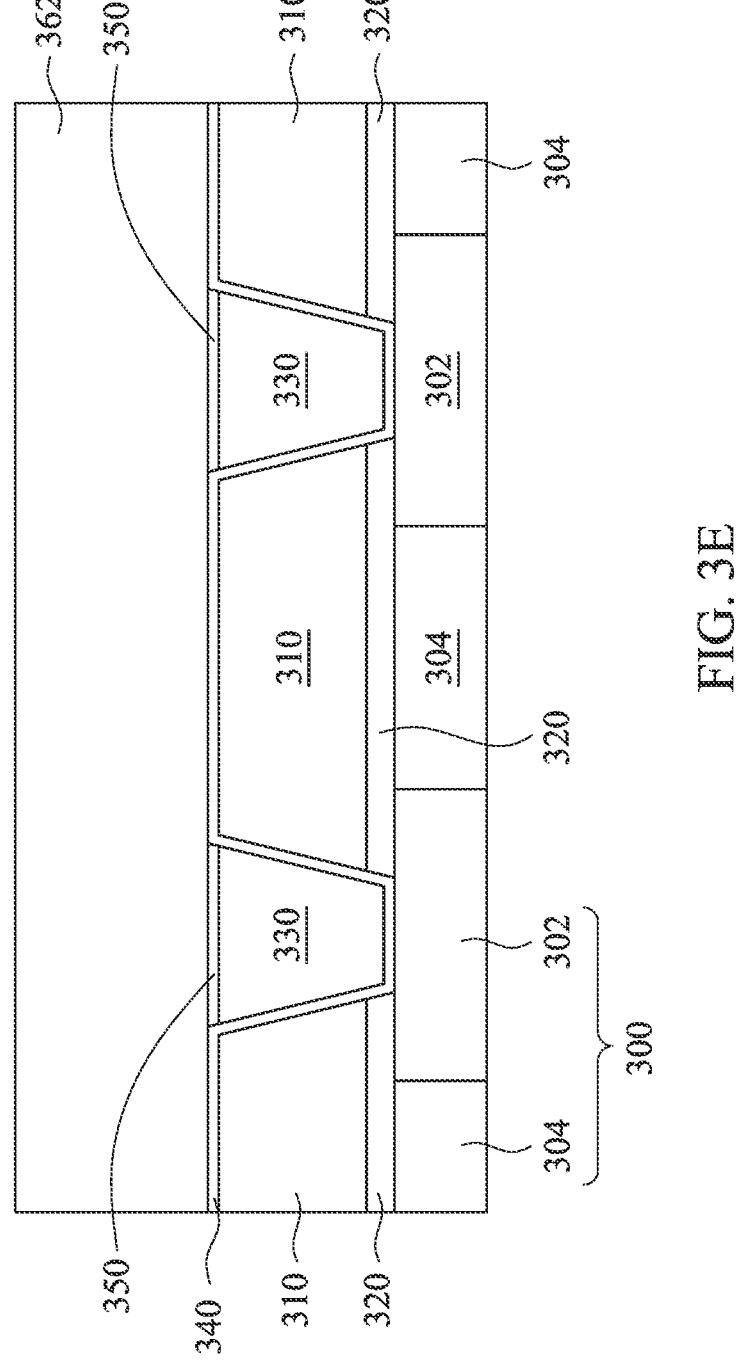
Figure 3F:
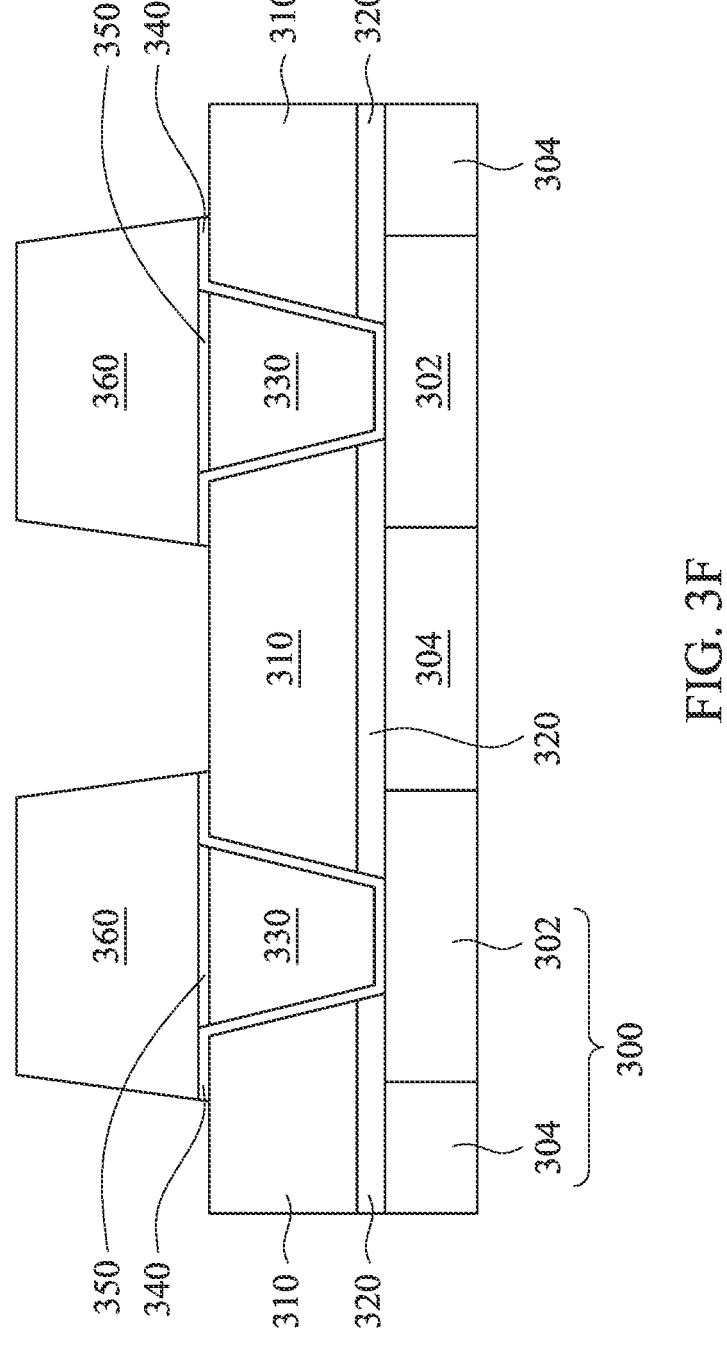

After the first capping layers 350 are completed, as shown in FIG. 3F, lines 360 are formed on the first capping layers 350 and portions of the barrier layer 340 on portions of the dielectric layer 310. In some examples, in forming the lines 360, as shown in FIG. 3E, a line material layer 362 is formed on the barrier layer 340 and the first capping layers 350. For example, the line material layer 362 may be formed by using an atomic layer deposition process, a chemical vapor deposition process, a physical vapor deposition (PVD) process, an electroless deposition process, or an electrochemical plating (ECP) process. The line material layer 362 has an etch selectivity with respect to the first capping layers 350. The line material layer 362 may be formed from metal, such as Cu, Ni, Co, Ru, Ir, Al, Pt, Pd, Au, Ag, Os, W, Mn, or alloys thereof. In some exemplary examples, a process temperature in forming the line material layer 362 is substantially equal to or smaller than 425 degrees centigrade. As shown in FIG. 3F, the line material layer 362 and the barrier layer 340 are patterned by using, for example, a photolithography technique and an etch technique. Portions of the line material layer 362 and portions of the barrier layer 340, which are underlying the portions of the line material layer 362, are removed, so as to form the lines 360 on the first capping layer 350 and the other portions of the barrier layer 340 on the dielectric layer 310.

The first capping layers 350 has an etch selectivity with respect to the line material layer 362, such that the first capping layers 350 may prevent the vias 330 from being damaged during the patterning process of the line material layer 362.

Figure 3G:
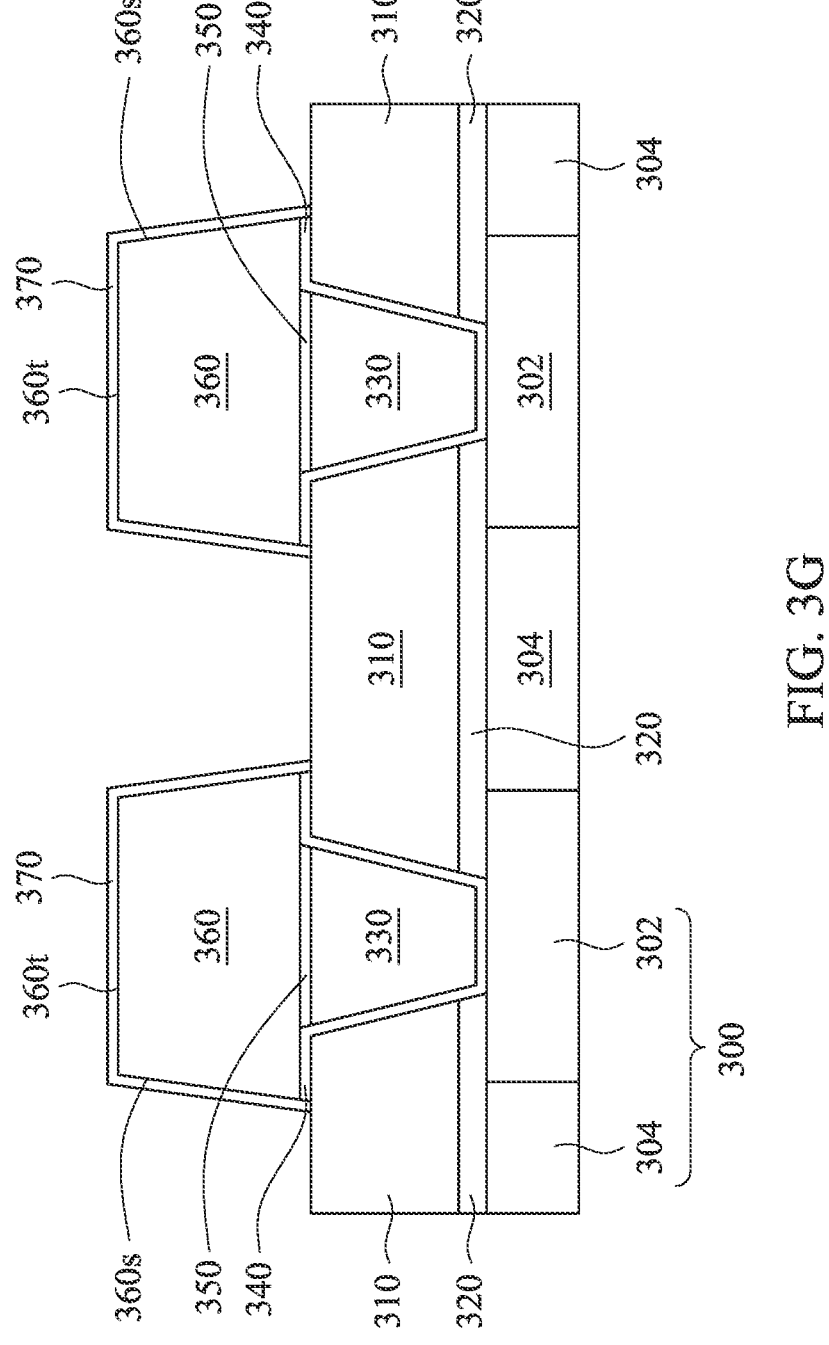

As shown in FIG. 3G, second capping layers 370 are respectively formed on top surfaces 360$t$ of the lines 360 to peripherally enclose side surfaces 360$s$ of the lines 360. Each of the first capping layers and the second capping layers 370 has an etch selectivity with respect to the lines 360. The second capping layers 370 may be formed from a conductive material. In some exemplary examples, the second capping layers 370 are formed from graphene. For example, the second capping layers 370 may be formed by using an atomic layer deposition process, a chemical vapor deposition process, a plasma-enhanced atomic layer deposition process, or a plasma-enhanced chemical vapor deposition process. A process temperature of forming the second capping layers 370 may be in a range substantially from 25 degrees centigrade to 1000 degrees centigrade. For example, the process temperature of forming the second capping layers 370 may be in a range substantially from 25 degrees centigrade to 425 degrees centigrade. Each of the second capping layers 370 may be formed to have a thickness substantially ranging from 3 angstroms to 30 angstroms.

In some exemplary examples, the second capping layers 370 include graphene layers, and are formed by using a chemical vapor deposition process or a plasma-enhanced chemical vapor deposition process. The graphene layers are grown under the catalyst of the lines 360. In the chemical vapor deposition process or a plasma-enhanced chemical vapor deposition process, reactants may include $C_xH_y$ and $H_z$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 3H:
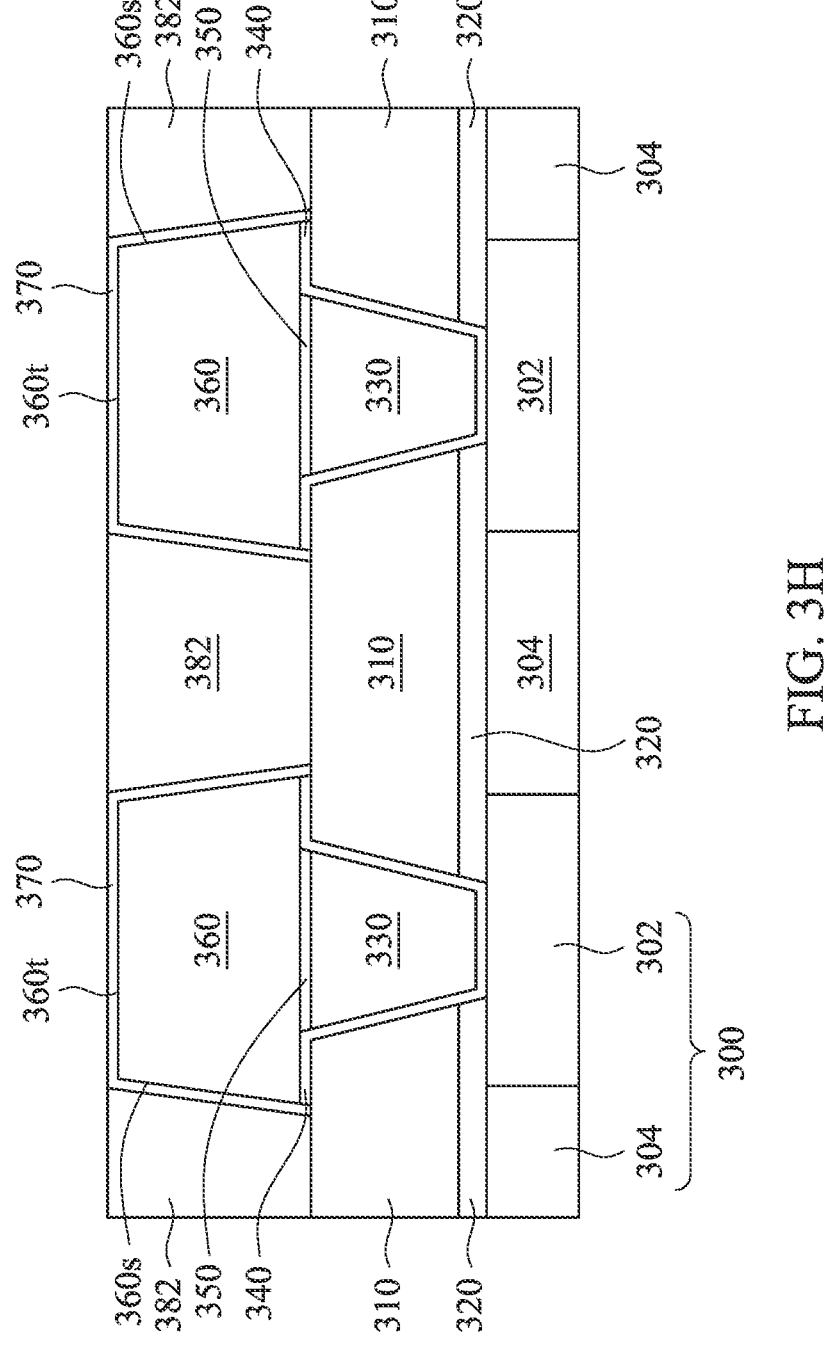
Figure 3I:
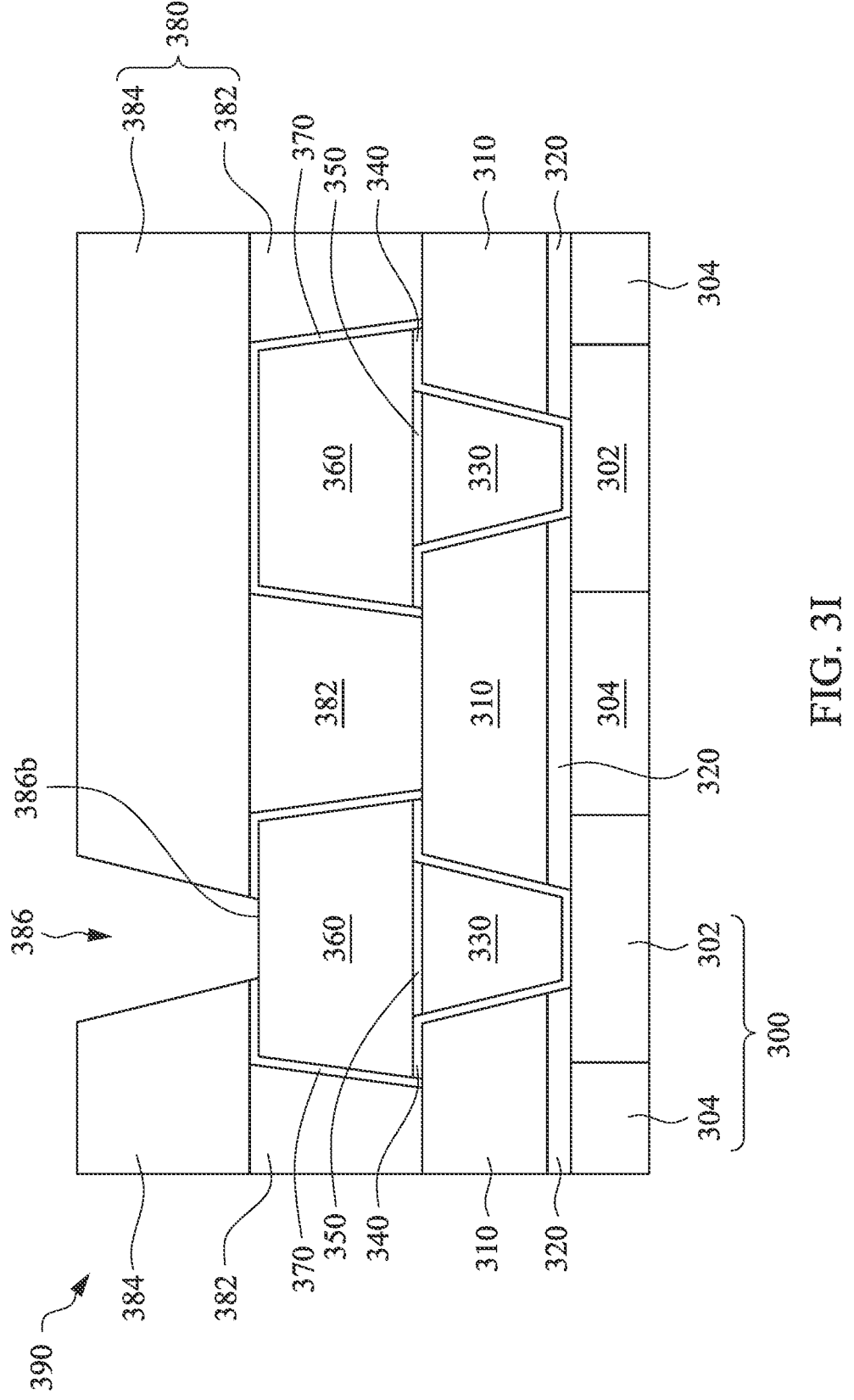

As shown in FIG. 3I, a dielectric layer 380 is formed on of the dielectric layer 310 and the second capping layers 370 to peripherally enclose the lines 360 to form a semiconductor device 390. For example, the dielectric layer 380 may be formed by using, a chemical vapor deposition process or a plasma-enhanced chemical vapor deposition process. In some exemplary examples, a process temperature in forming the dielectric layer 380 is substantially equal to or smaller than 425 degrees centigrade. A dielectric constant value of the dielectric layer 380 may be in a range substantially from 1.0 to 3.8. For example, the dielectric layer 380 may be formed from $SiO_x$, $SiO_xC_yH_z$, $SiO_xC_y$, $SiC_x$, $SiN_x$, or a low-K material. The dielectric layer 380 may be a single-layered structure. At least one via hole 386 is formed in the dielectric layer 380 over the line 360 by using, for example, a photolithography technique and an etch technique. The via hole 386 is formed to extend from the dielectric layer 380 to the second capping layer 370 or to the line 360, that is the via hole 386 is formed to have a bottom 386b which exposes the second capping layer 370 or the line 360.

In some exemplary examples, the dielectric layer 380 is formed to include at least two dielectric layers, such as a first dielectric layer 382 and a second dielectric layer 384. As shown in FIG. 3H, in forming the dielectric layer 380, the first dielectric layer 382 is formed on the dielectric layer 310 to peripherally enclose the lines 360. Portions of the second capping layers 370, which are located on top surfaces 360t of the lines 360, may not be covered by the first dielectric layer 382. As shown in FIG. 3I, the second dielectric layer 384 is formed on the first dielectric layer 382 and the second capping layers 370. The via hole 386 is formed in the second dielectric layer 384 over the line 360.

The second capping layers 370 have an etch selectivity with respect to the lines 360, such that the semiconductor device 390 does not need additional liner layers and barrier layers, thereby enhancing the RC performance of the semiconductor device 390 and reducing the fabrication cost. Moreover, the second capping layers 370 is used as etching stop layers during the patterning process of the via hole 386, such that an additional etching stop layer is omitted, thereby preventing the capacitance impact and reducing the fabrication cost.

Figure 4:
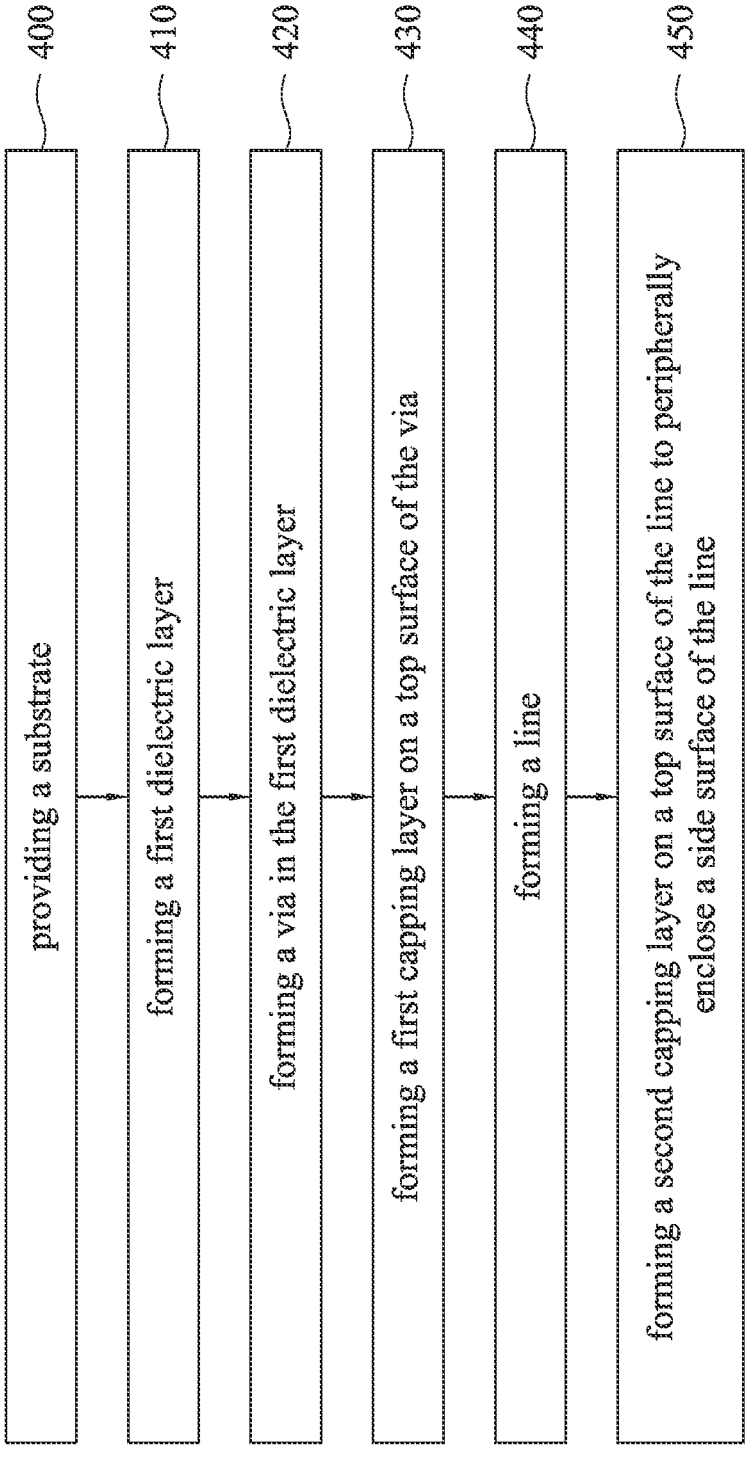
FIG. 4 is a flow chart of a method for manufacturing a semiconductor device in accordance with various embodiments.

Referring to FIG. 4 with FIG. 3A through FIG. 3I, FIG. 4 is a flow chart of a method for manufacturing a semiconductor device in accordance with various embodiments. The method begins at operation 400, where a substrate 300 is provided. In some exemplary examples, the substrate 300 is provided to include at least one dielectric layer 304 and at least one conductive layer 302, in which the conductive layer 302 is formed in the dielectric layer 304. A top surface 302t of the conductive layer 302 is not covered by the dielectric layer 304. The top surface 302t of the conductive layer 302 is formed to have a first portion 302a and a second portion 302b.

At operation 410, as shown in FIG. 3A, a dielectric layer 310 is formed on portions of the substrate 300 by using, for example, a chemical vapor deposition process or a plasma-enhanced chemical vapor deposition process. In some examples, before forming the dielectric layer 310, an etching stop layer 320 may be optionally formed to cover the substrate 300. The etching stop layer 320 is formed to have an etch selectivity with respect to the dielectric layer 310.

At operation 420, as shown FIG. 3C, one or more vias 330 are formed in the dielectric layer 310 on the second portions 302b of the top surfaces 302t of the conductive layers 302 respectively. In some examples, as shown in FIG. 3A, via holes 312 are firstly formed in the dielectric layer 310 and the etching stop layer 320 by using, for example, a photolithography technique and an etch technique. The via holes 312 correspond to the conductive layers 302 respectively, and each of the via holes 312 extends from the dielectric layer 310 passing through the etching stop layer 320 to the top surface 302t of the corresponding conductive layer 302 and exposes a second portion 302b of the top surface 302t of the corresponding conductive layer 302.

As shown in FIG. 3B, a barrier layer 340 may be optionally formed to cover a sidewall 312s and a bottom 312b of each of the via holes 312 and a top surface 310t of the dielectric layer 310. In some exemplary examples, the barrier layer 340 is formed to conformally cover the sidewalls 312s and the bottoms 312b of the via holes 312 and the top surface 310t of the dielectric layer 310.

Referring to FIG. 3B again, a via material layer 332 is formed on the barrier layer 340 to fill the via holes 312 with the via material layer 332. For example, the via material layer 332 may be formed by using an atomic layer deposition process, a chemical vapor deposition process, or an electroless deposition process. The via material layer 332 may be optionally annealed to eliminate holes 332h which may be formed in the via material layer 332.

As shown in FIG. 3C, a portion of the via material layer 332, which is disposed on the barrier layer 340 on the top surface 310t of the dielectric layer 310, is removed to form the vias 330 respectively in the via holes 312 by using a polishing technique or an etch technique. For example, a chemical mechanical polishing process may be performed on the via material layer 332 to remove the portion of the via material layer 332.

At operation 430, as shown FIG. 3C, first capping layers 350 are respectively formed on and cover top surfaces 330t of the vias 330. The first capping layers 350 may have an etch selectivity with respect to the vias 330. In some exemplary examples, the first capping layers 350 are formed from graphene. For example, the first capping layers 350 may be formed by using an atomic layer deposition process, a chemical vapor deposition process, a plasma-enhanced atomic layer deposition process, or a plasma-enhanced chemical vapor deposition process.

At operation 440, as shown in FIG. 3F, lines 360 are formed on the first capping layers 350 and portions of the barrier layer 340 on portions of the dielectric layer 310. In some examples, in forming the lines 360, as shown in FIG. 3E, a line material layer 362 is formed on the barrier layer 340 and the first capping layers 350 by using, for example, an atomic layer deposition process, a chemical vapor deposition process, a physical vapor deposition process, an electroless deposition process, or an electrochemical plating process. The line material layer 362 is formed to have an etch selectivity with respect to the first capping layers 350. As shown in FIG. 3F, the line material layer 362 and the barrier layer 340 are patterned to remove portions of the line material layer 362 and portions of the barrier layer 340, so as to form the lines 360 on the first capping layer 350 and the other portions of the barrier layer 340 on the dielectric layer 310.

At operation 450, as shown in FIG. 3G, second capping layers 370 are respectively formed on top surfaces 360$t$ of the lines 360 to peripherally enclose side surfaces 360$s$ of the lines 360. The second capping layers 370 have an etch selectivity with respect to the lines 360. In some exemplary examples, the second capping layers 370 are formed from graphene. For example, the second capping layers 370 may be formed by using an atomic layer deposition process, a chemical vapor deposition process, a plasma-enhanced atomic layer deposition process, or a plasma-enhanced chemical vapor deposition process.

In some examples, as shown in FIG. 3I, a dielectric layer 380 is formed on of the dielectric layer 310 and the second capping layers 370 to peripherally enclose the lines 360 to form a semiconductor device 390. For example, the dielectric layer 380 may be formed by using, a chemical vapor deposition process or a plasma-enhanced chemical vapor deposition process. The dielectric layer 380 may be a single-layered structure. At least one via hole 386 is formed in the dielectric layer 380 over the line 360. The via hole 386 is formed to extend from the dielectric layer 380 to the second capping layer 370 or to the line 360, that is the via hole 386 is formed to have a bottom 386$b$ which exposes the second capping layer 370 or the line 360.

In some exemplary examples, the dielectric layer 380 is formed to include at least two dielectric layers, such as a first dielectric layer 382 and a second dielectric layer 384. As shown in FIG. 3H, in forming the dielectric layer 380, the first dielectric layer 382 is formed on the dielectric layer 310 to peripherally enclose the lines 360. Portions of the second capping layers 370, which are located on top surfaces 360$t$ of the lines 360, may not be covered by the first dielectric layer 382. As shown in FIG. 3I, the second dielectric layer 384 is formed on the first dielectric layer 382 and the second capping layers 370. The via hole 386 is formed in the second dielectric layer 384 over the line 360.

Figure 5A:
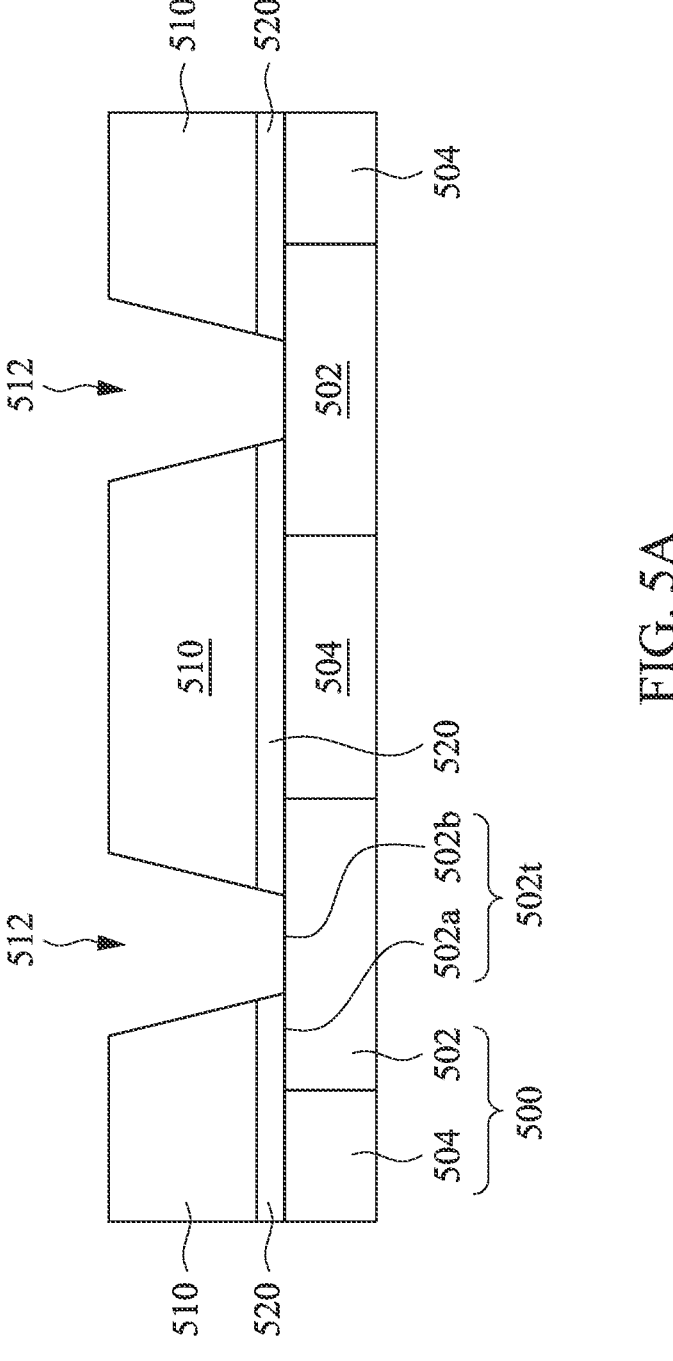
FIG. 5A through FIG. 5G are schematic cross-sectional views of intermediate stages showing a method for manufacturing a semiconductor device in accordance with various embodiments.

FIG. 5A through FIG. 5G are schematic cross-sectional views of intermediate stages showing a method for manufacturing a semiconductor device in accordance with various embodiments. As shown in FIG. 5A, a substrate 500 is provided. In some exemplary examples, the substrate 500 is provided to include at least one conductive layer 502 and at least one dielectric layer 504, in which the conductive layer 502 is formed in the dielectric layer 504, and a top surface 502$t$ of the conductive layer 502 is not covered by the dielectric layer 504. The top surface 502$t$ of the conductive layer 502 is formed to have a first portion 502$a$ and a second portion 502$b$. The conductive layer 502 may be formed from metal, such as Cu, Ni, Co, Ru, Ir, Al, Pt, Pd, Au, Ag, Os, W, Mn, or alloys thereof. In some certain examples, the conductive layer 502 may be formed to include an implant region. The dielectric layer 504 may be formed from $SiO_x$, $SiO_xC_yH_z$, $SiO_xC_y$, $SiC_x$, $SiN_x$, or a low-K material.

Referring to FIG. 5A again, a dielectric layer 510 is formed on portions of the substrate 500 by using, for example, a chemical vapor deposition process or a plasma-enhanced chemical vapor deposition process. In some exemplary examples, a process temperature in forming the dielectric layer 510 is substantially equal to or smaller than 425 degrees centigrade. A dielectric constant value of the dielectric layer 510 may be in a range substantially from 1.0 to 3.8. For example, the dielectric layer 510 may be formed from $SiO_x$, $SiO_xC_yH_z$, $SiO_xC_y$, $SiC_x$, $SiN_x$, or a low-K material. Optionally, before forming the dielectric layer 510, an etching stop layer 520 may be formed to cover the substrate 500, such that the etching stop layer 520 is disposed between the substrate 500 and the dielectric layer 510. The etching stop layer 520 has an etch selectivity with respect to the dielectric layer 510.

Figure 5B:
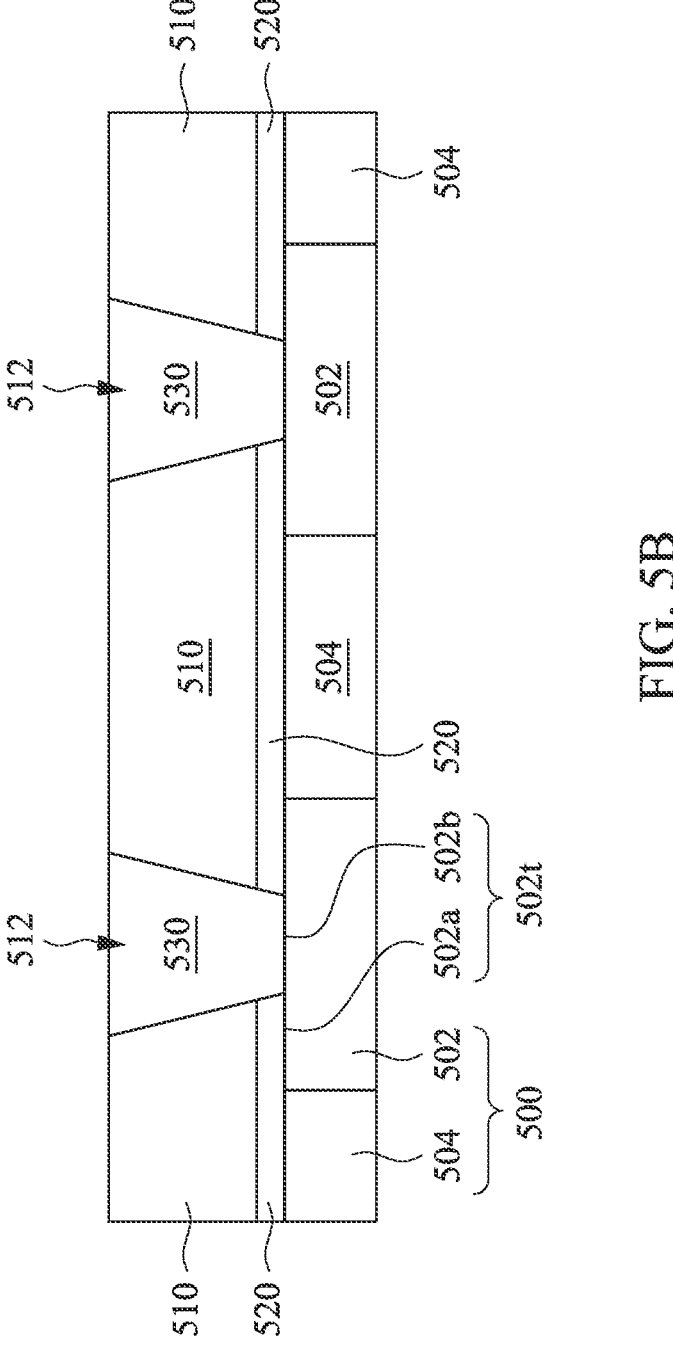

As shown in FIG. 5B, one or more vias 530 are formed in the dielectric layer 510 on the second portion 502$b$ of the top surface 502$t$ of the conductive layers 502 respectively. In some examples, in forming the vias 530, via holes 512 are formed in the dielectric layer 510 and the etching stop layer 520 by using, for example, a photolithography technique and an etch technique. As shown in FIG. 5A, the via holes 512 correspond to the conductive layers 502 respectively, and each of the via holes 512 extends from the dielectric layer 510 passing through the etching stop layer 520 to the top surface 502$t$ of the conductive layer 502 and exposes the second portion 502$b$ of the top surface 502$t$ of the conductive layer 502. After the via holes 512 are completed, the dielectric layer 510 and the etching stop layer 520 are located on the dielectric layer 504 and the first portions 502$a$ of the top surfaces 502$t$ of the conductive layers 502.

As shown in FIG. 5B, the via holes 512 are respectively filled with the vias 530. For example, the vias 530 may be formed by using an atomic layer deposition process, a chemical vapor deposition process, or an electroless deposition process. The vias 530 may be formed from metal, such as Cu, Ni, Co, Ru, Ir, Al, Pt, Pd, Au, Ag, Os, W, Mn, or alloys thereof. In some exemplary examples, a process temperature in forming the vias 530 is substantially equal to or smaller than 425 degrees centigrade.

Figure 5C:
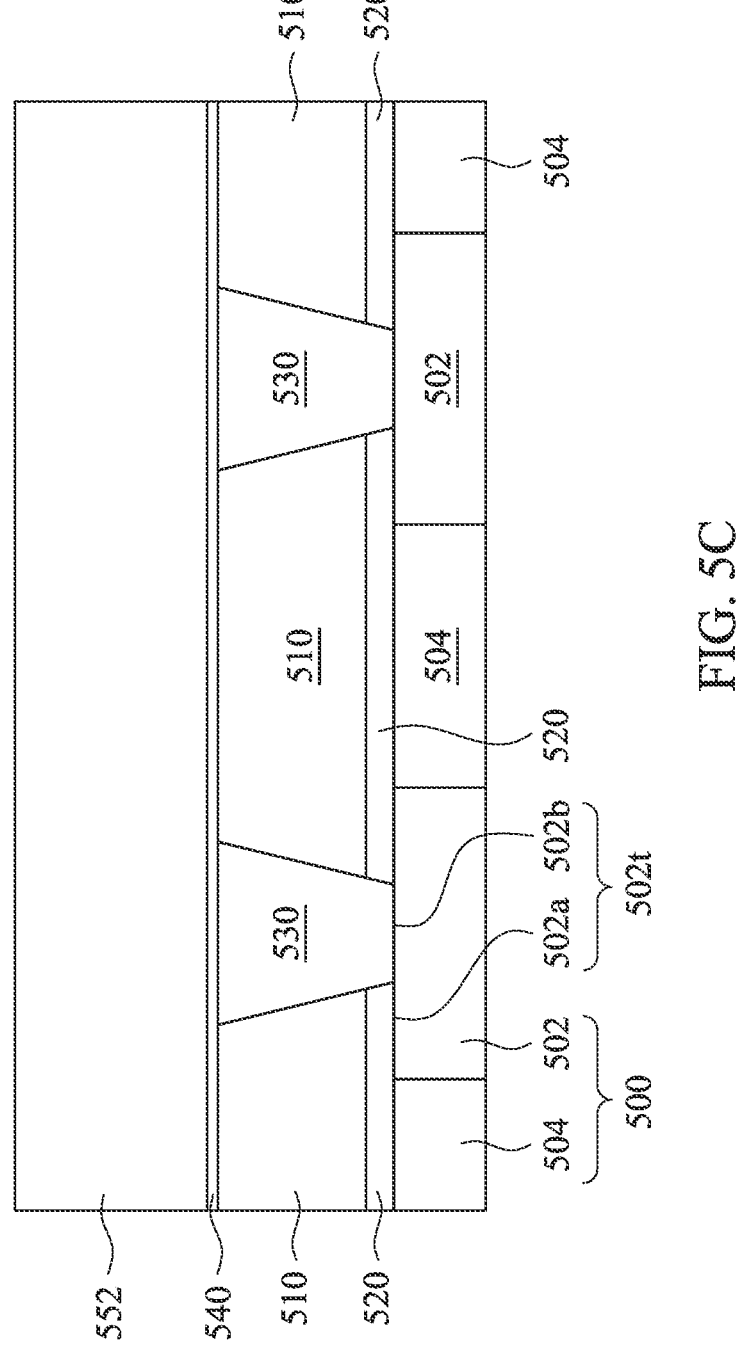

As shown in FIG. 5C, a barrier layer 540 may be optionally formed to cover the dielectric layer 510 and the vias 530. For example, the barrier layer 540 may be formed by using a chemical vapor deposition process or a plasma-enhanced chemical vapor deposition process. The barrier layer 540 may be formed from $TaN_x$.

Figure 5D:
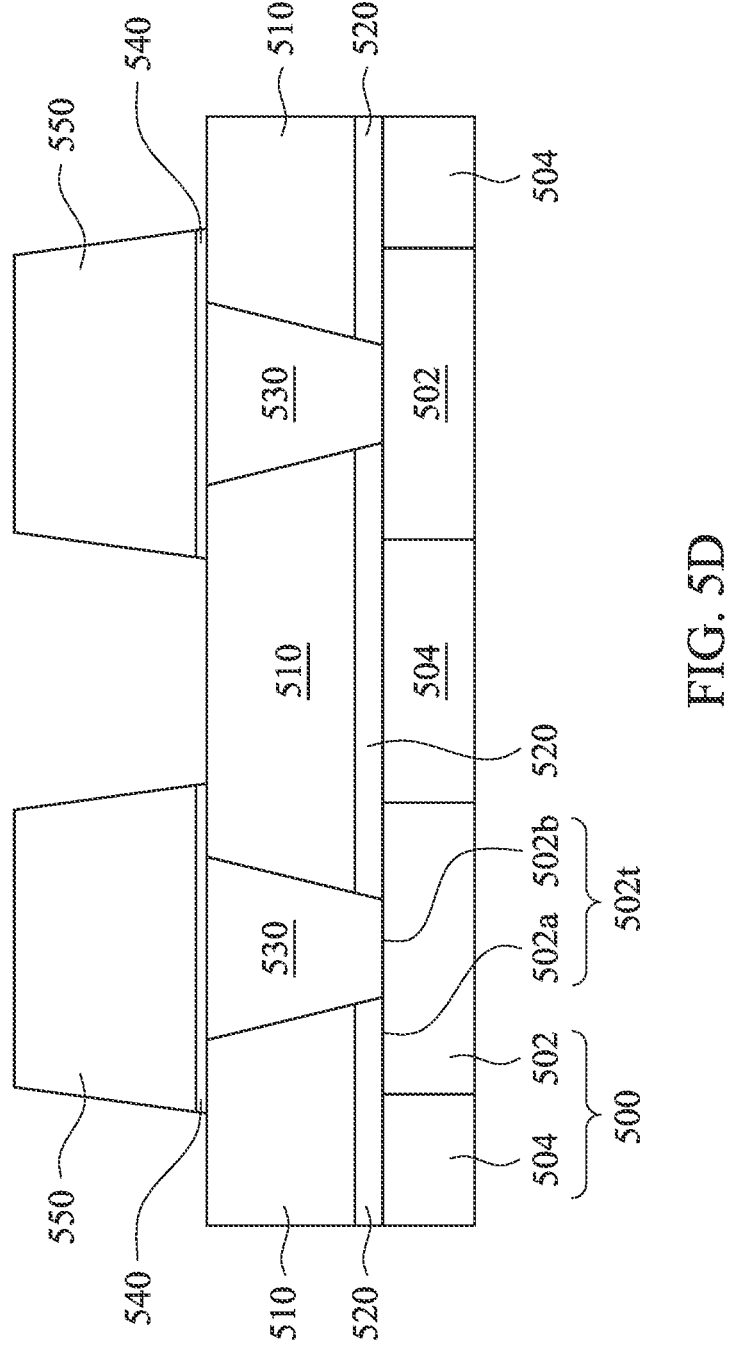

As shown in FIG. 5D, lines 550 are formed on portions of the barrier layer 540, which are located on the vias 530 and portions of the dielectric layer 510. In some examples, in forming the lines 550, as shown in FIG. 5C, a line material layer 552 is formed to cover the barrier layer 540. For example, the line material layer 552 may be formed by using an atomic layer deposition process, a chemical vapor deposition process, a physical vapor deposition process, an electroless deposition process, or an electrochemical plating process. The line material layer 552 and the vias 530 are formed from different materials, and the line material layer 552 has an etch selectivity with respect to vias 530. The line material layer 552 may be formed from metal, such as Cu, Ni, Co, Ru, Ir, Al, Pt, Pd, Au, Ag, Os, W, Mn, or alloys thereof. In some exemplary examples, a process temperature in forming the line material layer 552 is substantially equal to or smaller than 425 degrees centigrade. As shown in FIG. 5D, the line material layer 552 and the barrier layer 540 are patterned by using, for example, a photolithography technique and an etch technique. Portions of the line material layer 552 and portions of the barrier layer 540, which are underlying the portions of the line material layer 552, are removed, so as to form the lines 550 on the other portions of the barrier layer 540, which are located on the vias 530 and the portions of the dielectric layer 510.

The vias 530 have an etch selectivity with respect to the line material layer 552, such that it may prevent the vias 530 from being damaged during the patterning process of the line material layer 552.

Figure 5E:
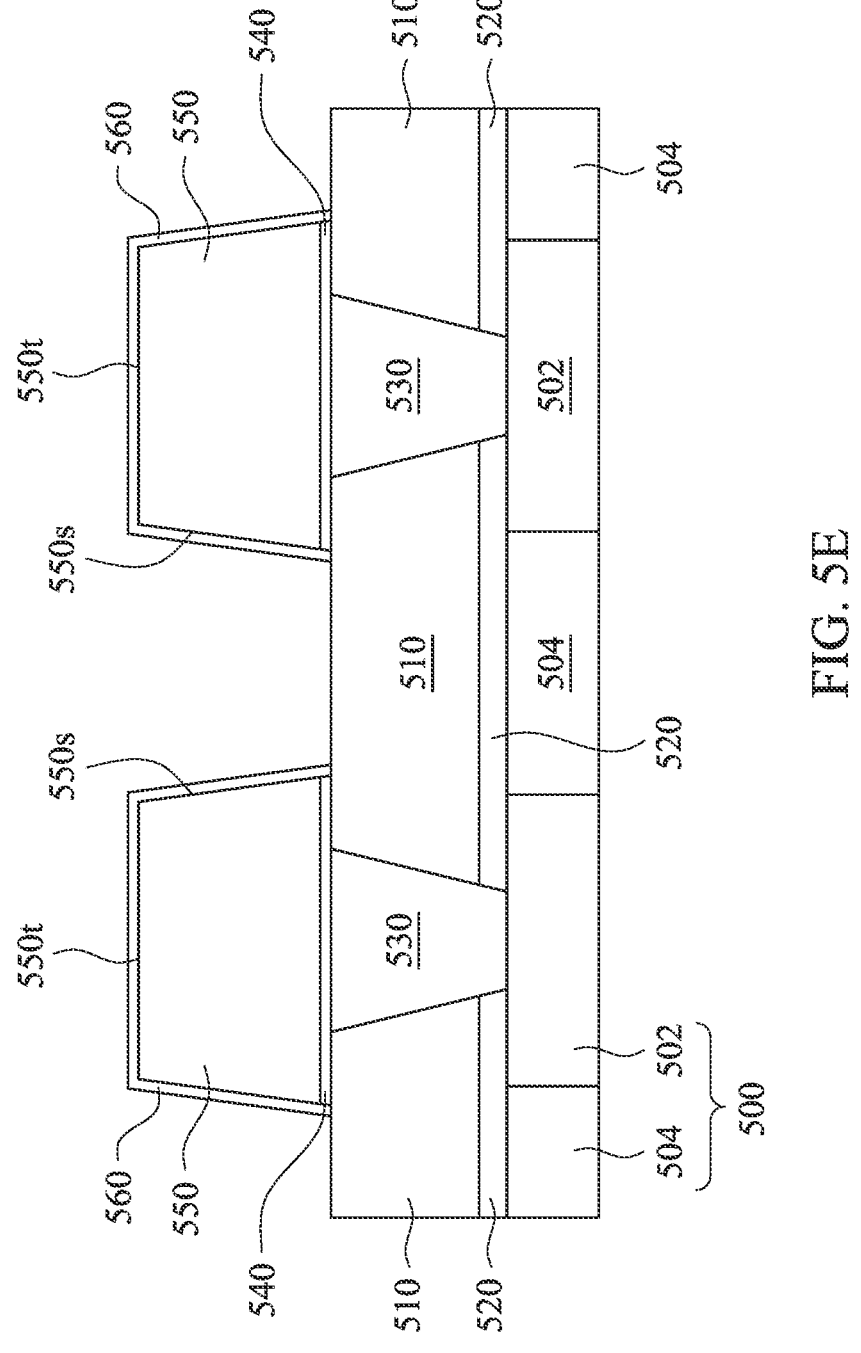

As shown in FIG. 5E, capping layers 560 are respectively formed on top surfaces 550t of the lines 550 to peripherally enclose side surfaces 550s of the lines 550. The capping layers 560 have an etch selectivity with respect to the lines 550. The capping layers 560 may be formed from a conductive material. In some exemplary examples, the capping layers 560 are formed from graphene. For example, the capping layers 560 may be formed by using an atomic layer deposition process, a chemical vapor deposition process, a plasma-enhanced atomic layer deposition process, or a plasma-enhanced chemical vapor deposition process. A process temperature of forming the capping layers 560 may be in a range substantially from 25 degrees centigrade to 1000 degrees centigrade. For example, the process temperature of forming the capping layers 560 may be in a range substantially from 25 degrees centigrade to 425 degrees centigrade. Each of the capping layers 560 may be formed to have a thickness substantially ranging from 3 angstroms to 30 angstroms.

In some exemplary examples, the capping layers 560 include graphene layers, and are formed by using a chemical vapor deposition process or a plasma-enhanced chemical vapor deposition process. The graphene layers are grown under the catalyst of the lines 550. In the chemical vapor deposition process or a plasma-enhanced chemical vapor deposition process, reactants may include $C_xH_y$ and $H_2$, a flow of the reactants may be in a range substantially from 100 sccm to 10000 sccm, a process pressure is in a range substantially from 0.1 torr to 760 torr, and a process temperature may be in a range substantially from 25 degrees centigrade to 425 degrees centigrade. In the plasma-enhanced chemical vapor deposition process, a plasma power may be in a range substantially from 50 W to 1000 W.

Figure 5F:
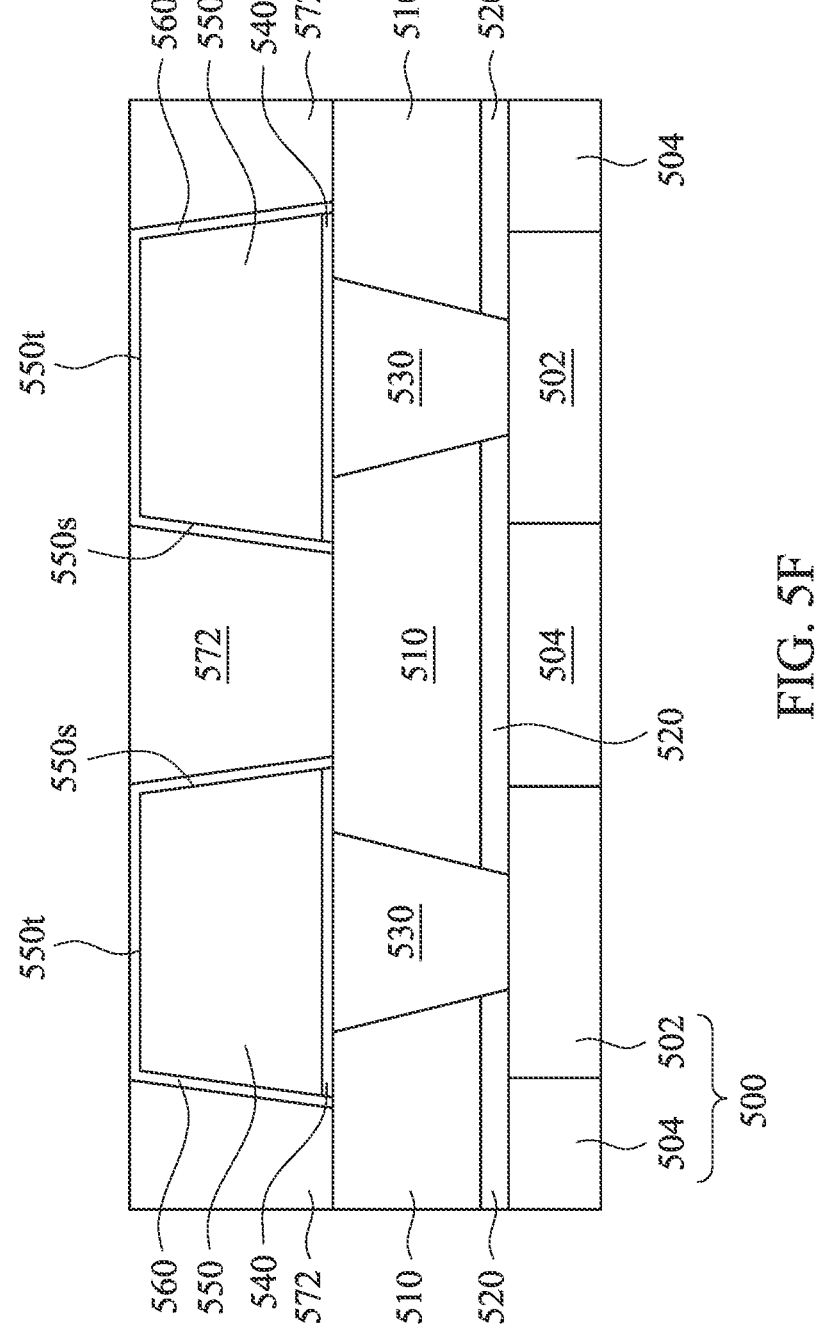
Figure 5G:
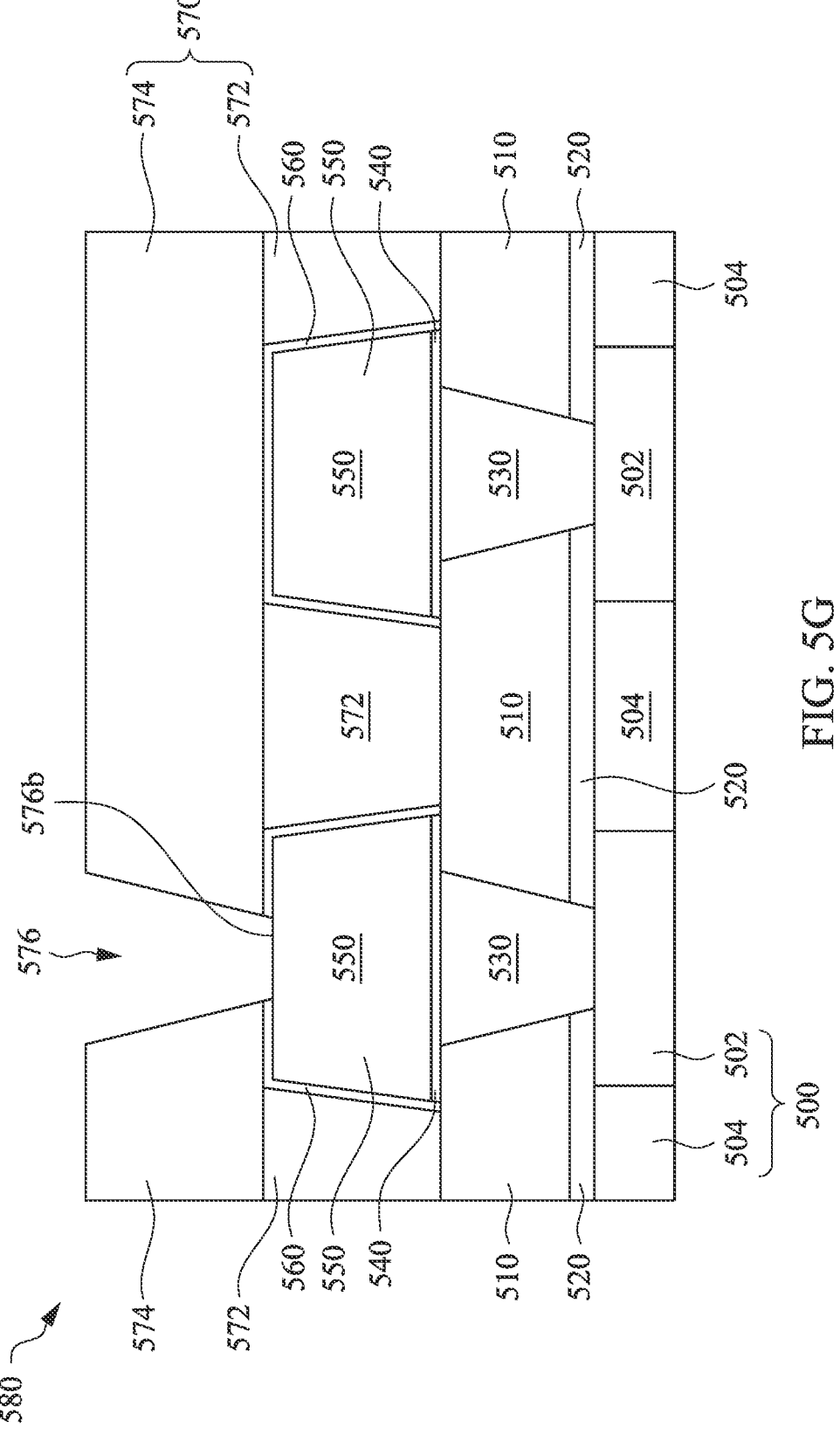

As shown in FIG. 5G, a dielectric layer 570 is formed on of the dielectric layer 510 and the capping layers 560 to peripherally enclose the lines 550 to form a semiconductor device 580. For example, the dielectric layer 570 may be formed by using, a chemical vapor deposition process or a plasma-enhanced chemical vapor deposition process. In some exemplary examples, a process temperature in forming the dielectric layer 570 is substantially equal to or smaller than 425 degrees centigrade. A dielectric constant value of the dielectric layer 570 may be in a range substantially from 1.0 to 3.8. For example, the dielectric layer 570 may be formed from $SiO_x$, $SiO_xC_yH_z$, $SiO_xC_y$, $SiC_x$, $SiN_x$, or a low-K material. The dielectric layer 570 may be a single-layered structure. At least one via hole 576 is formed in the dielectric layer 570 over the line 550 by using, for example, a photolithography technique and an etch technique. The via hole 576 is formed to extend from the dielectric layer 570 to the capping layer 560 or to the line 550, that is the via hole 576 is formed to have a bottom 576b which exposes the capping layer 560 or the line 550.

In some exemplary examples, the dielectric layer 570 is formed to include at least two dielectric layers, such as a first dielectric layer 572 and a second dielectric layer 574. As shown in FIG. 5F, in forming the dielectric layer 570, the first dielectric layer 572 is formed on the dielectric layer 510 to peripherally enclose the lines 550. Portions of the capping layers 560, which are located on top surfaces 550t of the lines 550, may not be covered by the first dielectric layer 572. As shown in FIG. 5G, the second dielectric layer 574 is formed on the first dielectric layer 572 and the capping layers 560. The via hole 576 is formed in the second dielectric layer 574 over the line 550.

The capping layers 560 have an etch selectivity with respect to the lines 550, such that additional liner layers and barrier layers are omitted, thereby enhancing the RC performance of the semiconductor device 580 and reducing the fabrication cost. Moreover, the capping layers 560 is used as etching stop layers during the patterning process of the via hole 576, such that an additional etching stop layer is omitted, thereby preventing the capacitance impact and reducing the fabrication cost.

Figure 6:
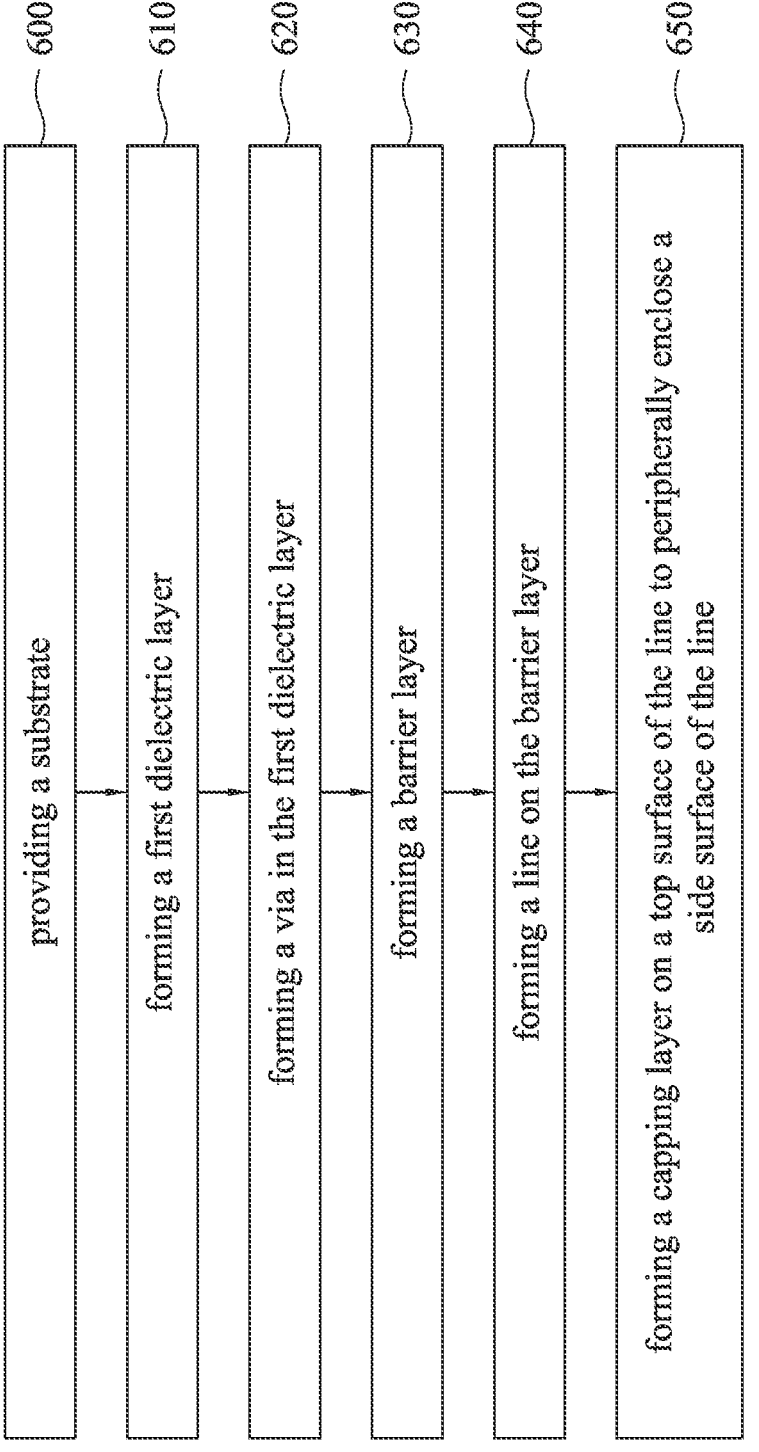
FIG. 6 is a flow chart of a method for manufacturing a semiconductor device in accordance with various embodiments.

Referring to FIG. 6 with FIG. 5A through FIG. 5G, FIG. 6 is a flow chart of a method for manufacturing a semiconductor device in accordance with various embodiments. The method begins at operation 600, where a substrate 500 is provided. In some exemplary examples, the substrate 500 is provided to include at least one conductive layer 502 and at least one dielectric layer 504, in which the conductive layer 502 is formed in the dielectric layer 504, and a top surface 502t of the conductive layer 502 is not covered by the dielectric layer 504. The top surface 502t of the conductive layer 502 is formed to have a first portion 502a and a second portion 502b.

At operation 610, referring to FIG. 5A again, a dielectric layer 510 is formed on portions of the substrate 500 by using, for example, a chemical vapor deposition process or a plasma-enhanced chemical vapor deposition process. Optionally, before forming the dielectric layer 510, an etching stop layer 520 may be formed to cover the substrate 500. The etching stop layer 520 has an etch selectivity with respect to the dielectric layer 510.

At operation 620, as shown in FIG. 5B, one or more vias 530 are formed in the dielectric layer 510 on the second portion 502b of the top surface 502t of the conductive layers 502 respectively. In some examples, in forming the vias 530, via holes 512 are formed in the dielectric layer 510 and the etching stop layer 520. As shown in FIG. 5A, the via holes 512 correspond to the conductive layers 502 respectively, and each of the via holes 512 extends from the dielectric layer 510 to the top surface 502t of the conductive layer 502 and exposes the second portion 502b of the top surface 502t of the conductive layer 502. As shown in FIG. 5B, the via holes 512 are respectively filled with the vias 530. For example, the vias 530 may be formed by using an atomic layer deposition process, a chemical vapor deposition process, or an electroless deposition process.

At operation 630, as shown in FIG. 5C, a barrier layer 540 may be optionally formed to cover the dielectric layer 510 and the vias 530. In some exemplary examples, the barrier layer 540 is formed by using a chemical vapor deposition process or a plasma-enhanced chemical vapor deposition process.

At operation 640, as shown in FIG. 5D, lines 550 are formed on portions of the barrier layer 540, which are located on the vias 530 and portions of the dielectric layer 510. In some examples, in forming the lines 550, as shown in FIG. 5C, a line material layer 552 is formed to cover the barrier layer 540 by using, for example, an atomic layer deposition process, a chemical vapor deposition process, a physical vapor deposition process, an electroless deposition process, or an electrochemical plating process. The line material layer 552 and the vias 530 are formed from different materials, and the line material layer 552 has an etch selectivity with respect to vias 530. As shown in FIG. 5D, the line material layer 552 and the barrier layer 540 are patterned by using, for example, a photolithography technique and an etch technique. Portions of the line material layer 552 and underlying portions of the barrier layer 540 are removed, so as to form the lines 550 on the other portions of the barrier layer 540, which are located on the vias 530 and the portions of the dielectric layer 510.

At operation 650, as shown in FIG. 5E, capping layers 560 are respectively formed on top surfaces 550t of the lines 550 to peripherally enclose side surfaces 550s of the lines 550. The capping layers 560 have an etch selectivity with respect to the lines 550. In some exemplary examples, the capping layers 560 are formed from graphene. For example, the capping layers 560 may be formed by using an atomic layer deposition process, a chemical vapor deposition process, a plasma-enhanced atomic layer deposition process, or a plasma-enhanced chemical vapor deposition process.

As shown in FIG. 5G, a dielectric layer 570 is formed on of the dielectric layer 510 and the capping layers 560 to peripherally enclose the lines 550 to form a semiconductor device 580. For example, the dielectric layer 570 may be formed by using, a chemical vapor deposition process. The dielectric layer 570 may be a single-layered structure. At least one via hole 576 is formed in the dielectric layer 570 over the line 550 by using, for example, a photolithography technique and an etch technique. The via hole 576 is formed to have a bottom 576b which exposes the capping layer 560 or the line 550.

In some exemplary examples, the dielectric layer 570 is formed to include at least two dielectric layers, such as a first dielectric layer 572 and a second dielectric layer 574. As shown in FIG. 5F, in forming the dielectric layer 570, the first dielectric layer 572 is formed on the dielectric layer 510 to peripherally enclose the lines 550. As shown in FIG. 5G, the second dielectric layer 574 is formed on the first dielectric layer 572 and the capping layers 560. The via hole 576 is formed in the second dielectric layer 574 over the line 550.

In some embodiments, a semiconductor substrate, a via, a first dielectric layer, a first graphene layer, a metal line, and a second graphene layer. The via is over the semiconductor substrate. The first dielectric layer laterally surrounds the via. The first graphene layer extends along a top surface of the via. The metal line is over the via and is in contact with the first graphene layer. The second graphene layer peripherally encloses the metal line and the first graphene layer.

In some embodiments, a semiconductor structure includes a semiconductor substrate, a first dielectric layer, a via, a metal line, a first graphene layer, and a second dielectric layer. The first dielectric layer is over the semiconductor substrate. The via passes through the first dielectric layer. The metal line is over the via. The first graphene layer has a lateral portion extending along a top surface of the metal line. The second dielectric layer laterally surrounds the first metal line, in which a top surface of the second dielectric layer is substantially level with a top surface of the lateral portion of the first graphene layer.

In some embodiments, a semiconductor structure includes a semiconductor substrate, a dielectric layer, a via, a barrier layer, a graphene layer, and a metal line. The dielectric layer is over the semiconductor substrate. The via passes through the dielectric layer. The barrier layer extends along a bottom surface of the via, along a sidewall of the via, and along a top surface of the dielectric layer. The graphene layer is over the via. The metal line is over the graphene layer.

In some embodiments, an interconnect structure includes a lower metal, a dielectric layer, an upper metal, and a graphene layer. The dielectric layer laterally surrounds the lower metal. The upper metal is over the lower metal. The graphene layer is over a top surface of the upper metal and opposite side surfaces of the upper metal from a cross-sectional view. In some embodiments, the graphene layer is in contact with the first dielectric layer. In some embodiments, the upper metal has a bottom surface free from coverage by the graphene layer. In some embodiments, the interconnect structure further includes a second dielectric layer laterally surrounding the upper metal, the second dielectric layer having a top surface level with a top surface of the graphene layer. In some embodiments, the lower metal has a width decreasing as a distance from the upper metal increases. In some embodiments, a maximal lateral dimension of the upper metal is greater than a maximal lateral dimension of the lower metal from the cross-sectional view. In some embodiments, the interconnect structure further includes a barrier layer sandwiched between the lower and upper metals and extending from a first edge of a bottom surface of the upper metal to a second edge of the bottom surface of the upper metal opposite to the first edge. In some embodiments, the opposite side surfaces of the upper metal are free from coverage by the barrier layer. In some embodiments, the interconnect structure further includes a metal nitride layer cupping an underside of the lower metal. In some embodiments, the metal nitride layer further extends to a top surface of the first dielectric layer and in contact with the graphene layer.

In some embodiments, an interconnect structure includes a dielectric layer, a first metal, a second metal, a metal nitride layer, and a graphene layer. The first metal is in a first dielectric layer. The second metal is over the first metal. The metal nitride layer is between the first and second metals and extends from a first edge of a bottom surface of the second metal to a second edge of the bottom surface of the second metal opposite to the first edge from a cross-sectional view. The graphene layer cups a topside of the second metal. In some embodiments, the graphene layer is in contact with the metal nitride layer. In some embodiments, the first metal has opposite sidewalls free from coverage by the metal nitride layer. In some embodiments, the second metal has opposite sidewalls free from coverage by the metal nitride layer. In some embodiments, the interconnect structure further includes a second dielectric layer laterally surrounding the second metal, the second dielectric layer having a top surface level with a top surface of the graphene layer.

In some embodiments, an interconnect structure includes a substrate, a conductive via, a conductive line, a first graphene layer, a second graphene layer, and a barrier layer. The conductive via is over the substrate. The conductive line is over the conductive via. The first graphene layer spaces the conductive line apart from the conductive via. The second graphene layer wraps the conductive line. The barrier layer cups an underside of the conductive via and is in contact with the first and second graphene layers. In some embodiments, the first graphene layer is in a position higher than a bottom end of the second graphene layer. In some embodiments, the first graphene layer is spaced apart from the second graphene layer. In some embodiments, the conductive line extends past the first graphene layer. In some embodiments, the conductive line has a wider width than the first graphene layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
a substrate;
a conductive via over the substrate;
a conductive line over the conductive via;
a first graphene layer spacing the conductive line apart from the conductive via;
a second graphene layer wrapping the conductive line; and
a barrier layer cupping an underside of the conductive via and in contact with the first and second graphene layers.

2. The interconnect structure of claim 1, wherein the first graphene layer is in a position higher than a bottom end of the second graphene layer.

3. The interconnect structure of claim 1, wherein the first graphene layer is spaced apart from the second graphene layer.

4. The interconnect structure of claim 1, wherein the conductive line extends past the first graphene layer.

5. The interconnect structure of claim 1, wherein the conductive line has a wider width than the first graphene layer.

6. An interconnect structure, comprising:
a first metal in a first dielectric layer;
a second metal over the first metal;
a metal nitride layer extending from a first edge of a bottom surface of the second metal, along sidewalls of the first metal, to a second edge of the bottom surface of the second metal opposite to the first edge from a cross-sectional view; and
a first graphene layer cupping a topside of the second metal.

7. The interconnect structure of claim 6, wherein the first graphene layer is in contact with the metal nitride layer.

8. The interconnect structure of claim 6, wherein the metal nitride layer is disposed on a bottom surface of the first metal.

9. The interconnect structure of claim 6, wherein the second metal has opposite sidewalls free from coverage by the metal nitride layer.

10. The interconnect structure of claim 6, further comprising:
a second dielectric layer laterally surrounding the second metal, the second dielectric layer having a top surface level with a top surface of the first graphene layer.

11. The interconnect structure of claim 6, wherein the metal nitride layer cups an underside of the first metal, further extends to a top surface of the first dielectric layer, and is in contact with the first graphene layer.

12. The interconnect structure of claim 6, further comprising:
a second graphene layer wrapping the second metal, wherein the metal nitride layer is in contact with the first and second graphene layers.

13. An interconnect structure, comprising:
a lower metal;
a first dielectric layer laterally surrounding the lower metal;
an upper metal over the lower metal;
a graphene layer over a top surface of the upper metal and opposite side surfaces of the upper metal from a cross-sectional view; and
a metal nitride layer cupping an underside of the lower metal, wherein the metal nitride layer further extends to a top surface of the first dielectric layer and in contact with the graphene layer.

14. The interconnect structure of claim 13, wherein the graphene layer is in contact with the first dielectric layer.

15. The interconnect structure of claim 13, wherein the upper metal has a bottom surface free from coverage by the graphene layer.

16. The interconnect structure of claim 13, further comprising:
a second dielectric layer laterally surrounding the upper metal, the second dielectric layer having a top surface level with a top surface of the graphene layer.

17. The interconnect structure of claim 13, wherein the lower metal has a width decreasing as a distance from the upper metal increases.

18. The interconnect structure of claim 13, wherein a maximal lateral dimension of the upper metal is greater than a maximal lateral dimension of the lower metal from the cross-sectional view.

19. The interconnect structure of claim 13, further comprising:
a barrier layer sandwiched between the lower and upper metals and extending from a first edge of a bottom surface of the upper metal to a second edge of the bottom surface of the upper metal opposite to the first edge.

20. The interconnect structure of claim 19, wherein the opposite side surfaces of the upper metal are free from coverage by the barrier layer.

* * * * *